(12) United States Patent
David et al.

(10) Patent No.: US 6,696,157 B1
(45) Date of Patent: Feb. 24, 2004

(54) DIAMOND-LIKE GLASS THIN FILMS

(75) Inventors: Moses Mekala David, Woodbury, MN (US); Brian John Gates, Eagan, MN (US); Brian Kenneth Nelson, Shoreview, MN (US); Louis C. Haddad, Mendota Heights, MN (US); Joel Rivard Dufresne, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/519,449

(22) Filed: Mar. 5, 2000

(51) Int. Cl.$^7$ ................................................. B32B 9/00
(52) U.S. Cl. ....................................... 428/408; 428/446
(58) Field of Search ................................. 428/408, 416

(56) References Cited

U.S. PATENT DOCUMENTS

| | | | |
|---|---|---|---|
| 4,661,409 A | 4/1987 | Kieser et al. | 428/408 |
| 4,777,090 A | 10/1988 | Ovshinsky et al. | 428/408 |

(List continued on next page.)

FOREIGN PATENT DOCUMENTS

| | | | |
|---|---|---|---|
| DE | 41 22 834 A | | 1/1993 |
| EP | 0 267 679 B1 | | 5/1988 |
| EP | 0 395 198 A2 A3 | | 10/1990 |
| EP | 0 448 227 A1 | | 9/1991 |
| EP | 0 598 361 A1 | | 5/1994 |
| EP | 0 743 375 A | | 11/1996 |
| EP | 0 856 592 A | | 8/1998 |
| GB | 2 105 371 A | | 3/1983 |
| JP | 59 083107 A | | 5/1984 |
| WO | WO 92/06843 | | 4/1992 |
| WO | WO 95/24275 | | 9/1995 |
| WO | WO 96/39943 | | 12/1996 |
| WO | WO 96 40446 A | | 12/1996 |
| WO | WO 97/13263 | | 4/1997 |
| WO | WO 97 40207 A | | 10/1997 |
| WO | WO 97 48836 A | | 12/1997 |
| WO | WO 99/10560 | | 3/1999 |
| WO | WO 99 29477 A | | 6/1999 |
| WO | WO 00/47402 | | 8/2000 |

OTHER PUBLICATIONS

Bray, D. J. et al.; "New Family of Tailorable Thin–Film Coatings", Advanced Materials & Processes, Metals Park, Ohio, vol. 146, No. 6, pp. 31–34. no date.

Lettington, A.H., "Application of Diamond–like Carbon Thin Films", Carbon, US, Elsevier Science Publishing, NY, vol. 36, No. 5–6, 1998, pp. 555–560. no month.

*Primary Examiner*—Archene Turner
(74) *Attorney, Agent, or Firm*—Melanie G. Gover; Douglas B. Little

(57) ABSTRACT

A diamond-like glass film is disclosed. In specific implementations, the film includes a diamond-like glass containing at least about 30 atomic percent carbon, at least about 25 atomic percent silicon, and less than or equal to about 45 atomic percent oxygen on a hydrogen-free basis. The diamond-like glass film may be applied to various substrates. The invention is also directed to articles having a diamond-like glass film, methods of making the articles, and apparatus for making the film and to articles.

14 Claims, 18 Drawing Sheets

U.S. PATENT DOCUMENTS

| | | | |
|---|---|---|---|
| 4,960,643 A | 10/1990 | Lemelson | 428/408 |
| 5,041,303 A | 8/1991 | Wertheimer et al. | 427/39 |
| 5,190,807 A | 3/1993 | Kimock et al. | 428/216 |
| 5,352,493 A | 10/1994 | Dorfman et al. | |
| H1461 H | 7/1995 | DiVita et al. | |
| 5,466,431 A | 11/1995 | Dorfman et al. | |
| 5,494,742 A * | 2/1996 | Seki et al. | 428/408 |
| 5,530,581 A | 6/1996 | Cogan | |
| 5,618,619 A | 4/1997 | Petrmichl et al. | 428/334 |
| 5,620,495 A | 4/1997 | Aspell et al. | |
| 5,638,251 A * | 6/1997 | Goel et al. | 361/313 |
| 5,677,051 A * | 10/1997 | Ueda et al. | 428/336 |
| 5,679,413 A | 10/1997 | Petrmichl et al. | 427/534 |
| 5,718,976 A | 2/1998 | Dorfman et al. | |
| 5,740,941 A | 4/1998 | Lemelson | |
| 5,745,615 A | 4/1998 | Atkins et al. | |
| 5,773,486 A | 6/1998 | Chandross et al. | |
| 5,912,999 A | 6/1999 | Brennan, III et al. | |
| 5,948,166 A | 9/1999 | David et al. | |
| 5,999,671 A | 12/1999 | Jin et al. | |
| 6,015,597 A * | 1/2000 | David | 427/577 |
| 6,046,758 A | 4/2000 | Brown et al. | 347/203 |
| 6,080,470 A | 6/2000 | Dorfman | 428/216 |
| 6,083,313 A * | 7/2000 | Venkatraman et al. | 428/446 |

\* cited by examiner

DIAMOND-LIKE GLASS THIN FILMS

TECHNICAL FIELD

The present invention relates to diamond-like glass, articles deposited with diamond-like glass, methods of making diamond-like glass, and apparatus for depositing diamond-like glass.

BACKGROUND

In recent years, various diamond-like thin films have been created which allow for the creation of hard deposits on various substrates. For example, U.S. Pat. No. 5,466,431 teaches diamond-like metallic nanocomposites, which are diamond-like interpenetrating networks of carbon stabilized by hydrogen and a silicone glass-like network stabilized by oxygen. Such nanocomposites are sometimes referred to as DYLYN, and are manufactured by Advanced Refractory Technologies of Buffalo, New York. Although DYLYN nanocomposites are useful for some applications, they have limitations making them unsuitable for many applications. For example, DYLYN is relatively absorbent to UV-visible light, which makes it unsuitable for applications where transparency of such light is necessary. Furthermore, DYLYN has a relatively high refractive index on the order of 1.7 to 2.5, which makes it of limited use when reflective losses must be limited, such as for anti-reflective coatings.

Similarly, various plasma deposited silicon oxide thin films have been generated. Such films, generically represented as $SiO_x$ are usually formed from silane/oxygen or silane/nitrous oxide mixtures and do not contain carbon. Again, although useful for some applications, these $SiO_x$ films are typically substantially optically absorbent and are also relatively brittle and prone to flex cracking. In addition, $SiO_x$ films are usually deposited at high temperatures in order to avoid formation of a porous film. Although these high temperatures can create dense films, they also limit the type of substrates that can be used without being degraded by heat.

Another type of hard thin film is plasma polymerized organosilicone (PPO). Some PPO is formed by fragmentation and deposit of precursor molecules in a plasma to form a plasma polymer that is deposited on a grounded electrode. However, this PPO often does not adequately cover and fill surface topographical features, and the size of the plasma polymer precludes some lateral mobility as they condense on the substrate. Lateral mobility refers to the ability of atoms deposited on a surface to move a slight distance from the spot where they first land, allowing them to fill holes and provide a more uniform coating. Other PPO includes condensed monomer molecules that are polymerized by using various energy sources, such as ultraviolet light or e-beam radiation. Again, although this PPO has some uses, it often does not form densely packed, random films, and therefore is not as hard or homogenous as desired for some applications.

SUMMARY OF THE INVENTION

While each of the aforementioned compositions has specific utility, a need exists for an improved hard thin film that can be deposited onto a variety of substrates, preferably including heat sensitive substrates. The film is also preferably flexible so that it can be applied to a wide variety of substrates, including flexible substrates. In addition, the thin film preferably allows transmission of most light, including ultraviolet light. Finally, the film preferably has diamond-like hardness and a minimum of porosity.

One aspect of the present invention is directed to an improved thin film having use in many different applications. The improved thin film is a diamond-like glass, and may be applied to various substrates. Other aspects of the invention aredirected to articles having a diamond-like glass film, methods of making the articles, and apparatus for making the film and articles.

The diamond-like glass (DLG) of the invention comprises a carbon-rich diamond-like amorphous covalent system containing carbon, silicon, hydrogen and oxygen. The DLG is created by depositing a dense random covalent system comprising carbon, silicon, hydrogen, and oxygen under ion bombardment conditions by locating a substrate on a powered electrode in a radio frequency ("RF") chemical reactor. In specific implementations, DLG is deposited under intense ion bombardment conditions from mixtures of tetramethylsilane and oxygen. Typically, DLG shows negligible optical absorption in the visible and ultraviolet regions (250 to 800 nm). Also, DLG usually shows improved resistance to flex-cracking compared to some other types of carbonaceous films and excellent adhesion to many substrates, including ceramics, glass, metals and polymers.

DLG contains at least about 30 atomic percent carbon, at least about 25 atomic percent silicon, and less than or equal to about 45 atomic percent oxygen. DLG typically contains from about 30 to about 50 atomic percent carbon. In specific implementations, DLG can include about 25 to about 35 atomic percent silicon. Also, in certain implementations, the DLG includes about 20 to about 40 atomic percent oxygen. In specific advantageous implementations the DLG comprises from about 30 to about 36 atomic percent carbon, from about 26 to about 32 atomic percent silicon, and from about 35 to about 41 atomic percent oxygen on a hydrogen free basis. "Hydrogen free basis" refers to the atomic composition of a material as established by a method such as Electron Spectroscopy for Chemical Analysis (ESCA), which does not detect hydrogen even if large amounts are present in the thin films. (References to compsitional percentages herein refer to atomic percents.)

Thin films made in accordance with the invention may have a variety of light transmissive properties. Thus, depending upon the composition, the thin films may have increased transmissive properties at various frequencies. In specific implementations the thin film is at least 50 percent transmissive to radiation at one or more wavelength from about 180 to about 800 nanometers. In other advantageous implementations the DLG film is transmissive to greater than 70 percent (and more advantageously greater than 90 percent) of radiation at one or more wavelengths from about 180 to about 800 nanometers. High transmissivity is typically preferred because it allows thicker films to be produced without significant reduction in radiation intensity passing through the film.

Regardless of how thick the film is, the DLG typically has an extinction coefficient of less than 0.002 at 250 nm and more typically less than 0.010 at 250 nm. Also, DLG usually has a refractive index greater than 1.4 and sometimes greater than 1.7. Notably, DLG shows low levels of fluorescence, typically very low, and sometimes low enough that it shows no fluorescence. Preferably, DLG's fluorescence is comparable, nearly equal, or equal to that of pure quartz.

The DLG of the invention can be used for numerous applications. These applications include use on a variety of substrates such as on elastomeric films, on relaxable films such as those disclosed in application Ser. No. 09/519,450, filed concurrently herewith, and incorporated herein by reference, on shrink films, for example to provide a surface treatment to improve wettability of the film, as a substrate for in situ synthesis of oligonucleotides, or as an abrasive surface. The thin films can be used as an internal or external treatment for glass or plastic capillaries, arrays, and biochips. For example, they can be used as an internal surface treatment for surface chemistry modification, or as an external treatment as an alternative to polymer coatings. The good optical properties, high temperature resistance, chemical resistance, and physical durability of DLG films makes them well suited for these purposes. Also, the DLG films can be applied to porous substrates, such as nonwoven cloth, providing further advantageous utility.

The invention is further directed to a method of depositing a diamond-like glass film onto a substrate. The method includes providing a capacitively coupled reactor system having two electrodes in an evacuable reaction chamber. The chamber is partially evacuated, and radio frequency power is applied to one of the electrodes. A carbon and silicon containing source is introduced between the electrodes to form a plasma including reactive species in proximity to the electrodes, and to also form an ion sheath proximate at least one electrode. The substrate is placed within the ion sheath and exposed to the reactive species to form a diamond-like glass on the substrate. The conditions can result in a thin film that includes, for example, a diamond-like structure having on a hydrogen-free basis at least 30 atomic percent carbon, at least 25 atomic percent silicon, and less than 45 atomic percent oxygen. The thin film can be made to a specific thickness, typically from 1 to 10 microns, but optionally less than 1 micron or more than 10 microns.

As used herein, the term "diamond-like glass" (DLG) refers to substantially or completely amorphous glass including carbon and silicon, and optionally including one or more additional component selected from the group including hydrogen, nitrogen, oxygen, fluorine, sulfur, titanium, and copper. Other elements may be present in certain embodiments. The amorphous diamond-like glass films of this invention may contain clustering of atoms to give it a short-range order but are essentially void of medium and long range ordering that lead to micro or macro crystallinity which can adversely scatter radiation having wavelengths of from 180 nm to 800 nm.

As used herein, the term "amorphous" means a substantially randomly-ordered non-crystalline material having no x-ray diffraction peaks or modest x-ray diffraction peaks. When atomic clustering is present, it typically occurs over dimensions that are small compared to the wavelength of the actinic radiation.

As used herein, the term "parallel plate reactor" means a reactor containing two electrodes, wherein the primary mechanism for current flow between the electrodes is capacitive coupling. The electrodes may be asymmetric, meaning that they may be of different size, shape, surface area, etc. and need not necessarily be parallel to each other. One electrode may be grounded, and one electrode may be the reaction chamber itself.

As used herein, the term "plasma" means a partially ionized gaseous or fluid state of matter containing reactive species which include electrons, ions, neutral molecules, free radicals, and other excited state atoms and molecules. Visible light and other radiation are typically emitted from the plasma as the species forming the plasma relax from various excited states to lower, or ground, states. The plasma usually appears as a colored cloud in the reaction chamber.

As used herein, the term "negative bias" means that an object (e.g., an electrode) has a negative electrical potential with respect to some other matter (e.g., a plasma) in its vicinity.

As used herein, the term "negative self bias", with respect to an electrode and a plasma, means a negative bias developed by application of power (e.g., radio frequency) to an electrode that creates a plasma.

Advantages of the invention will be apparent from the following description, figures, examples, and the appended claims.

BRIEF DESCRIPTION OF THE DRAWINGS

Embodiments of the present invention are set forth in the following description and are shown in the drawings. Similar numerals refer to similar parts throughout the drawings.

Figure 1:
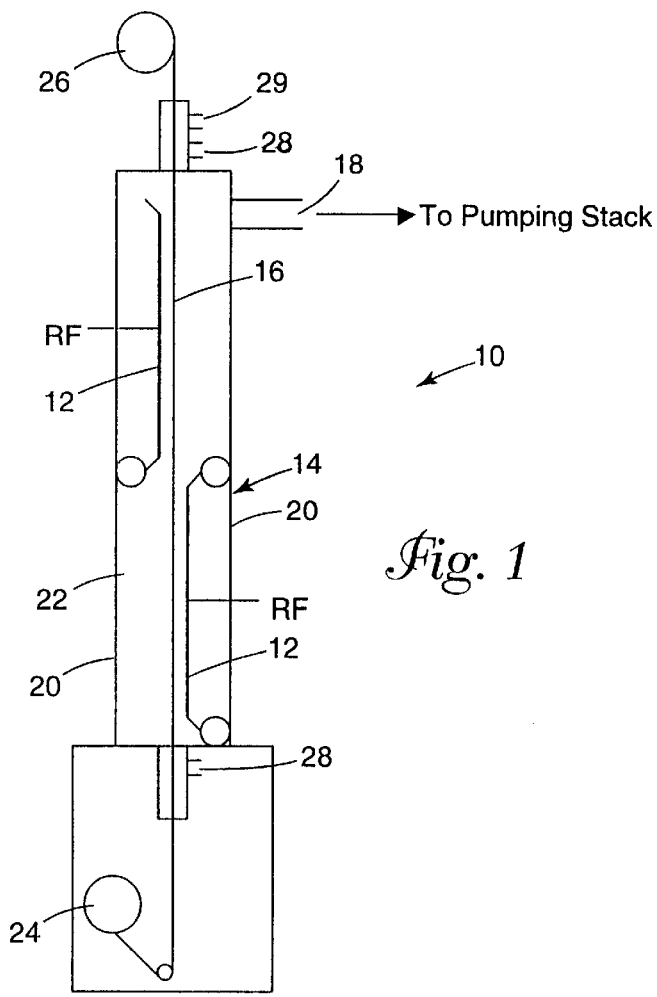
FIG. 1 is a schematic plan view of a first plasma reactor used to prepare examples of this invention.

The invention is susceptible to various modifications and alternative forms, and specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as described by the following detailed description and as defined by the appended claims.

DETAILED DESCRIPTION OF THE INVENTION

The present invention is directed to a diamond-like glass film, articles deposited with the diamond-like glass film, methods of making the articles, and apparatus for making the articles. In specific implementations, the articles include a glass substrate with a film of a diamond-like glass. More thorough descriptions of these films, articles, and methods are provided below.

A. Diamond-Like Glass (DLG)

Diamond-like glass is an amorphous carbon system including a substantial quantity of silicon and oxygen that exhibits diamond-like properties. In these films, on a hydrogen-free basis, there is at least 30% carbon, a substantial amount of silicon (typically at least 25%) and no more than 45% oxygen. The unique combination of a fairly high amount of silicon with a significant amount of oxygen and a substantial amount of carbon makes these films highly transparent and flexible (unlike glass).

Diamond-like glass thin films made in accordance with the invention may have a variety of light transmissive properties. Depending upon the composition, the thin films may have increased transmissive properties at various frequencies. However, in specific implementations the thin film is at least 70 percent transmissive to actinic radiation at one or more wavelength from about 180 to about 800 nanometers. Sources of actinic radiation may include a frequency doubled Argon laser, a neodymium YAG lasers equipped with frequency tripler and quadrupler crystals, $CO_2$ lasers, femto-second lasers, X-Rays, electron beams, proton beams, flames, plasmas, etc.

Diamond thin films, having significantly different properties from the amorphous diamond-like glass film of the present invention due to the arrangement and intermolecular bonds of carbon atoms in the specific material, have previously been deposited on substrates. The type and amount of intermolecular bonds are determined by infrared (IR) and nuclear magnetic resonance (NMR) spectra. Carbon deposits contain substantially two types of carbon-carbon bonds: trigonal graphite bonds ($sp^2$) and tetrahedral diamond bonds ($sp^3$). Diamond is composed of virtually all tetrahedral bonds, while diamond-like films are composed of approximately 50 to 90% tetrahedral bonds, and graphite is composed of virtually all trigonal bonds.

The crystalinity and the nature of the bonding of the carbon system determine the physical and chemical properties of the deposit. Diamond is crystalline whereas the diamond-like glass of the invention is a non-crystalline amorphous material, as determined by x-ray diffraction. Diamond is essentially pure carbon, whereas diamond-like glass contains a substantial amount of non-carbon components, including silicon.

Diamond has the highest packing density, or gram atom density (GAD) of any material at ambient pressure. Its GAD is 0.28 gram atoms/cc. Amorphous diamond-like films have a GAD ranging from about 0.20 to 0.28 gram atoms/cc. In contrast, graphite has a GAD of 0.18 gram atoms/cc. The high packing density of diamond like glass affords excellent resistance to diffusion of liquid or gaseous materials. Gram atom density is calculated from measurements of the weight and thickness of a material. "Gram atom" refers to the atomic weight of a material expressed in grams.

Amorphous diamond-like glass is diamond-like because, in addition to the foregoing physical properties that are similar to diamond, it has many of the desirable performance properties of diamond such as extreme hardness (typically 1000 to 2000 kg/mm$^2$), high electrical resistivity (often $10^9$ to $10^{13}$ ohm-cm), a low coefficient of friction (for example, 0.1), and optical transparency over a wide range of wavelengths (a typical extinction coefficient of less than 0.1 in the 400 to 800 nanometer range).

Diamond films also have some properties which, in many applications, make them less beneficial than amorphous diamond-like glass films. Diamond films usually have grain structures, as determined by electron microscopy. The grain boundaries are a path for chemical attack and degradation of the substrates, and also cause scattering of actinic radiation. Amorphous diamond-like glass does not have a grain structure, as determined by electron microscopy, and is thus well suited to applications wherein actinic radiation will pass through the film.

The polycrystalline structure of diamond films causes light scattering from the grain boundaries, which can reduce "write-through" efficiency. Write-through refers to the ability to transmit actinic radiation through a film such that the optical properties of the underlying substrate may be altered. One such example is creating gratings in optical fibers. Gratings are regions in an optical fiber having periodic or quasi-periodic variations in refractive index. The concept of write-through is addressed more thoroughly in copending U.S. application Ser. No. 09/519,447, filed concurrently herewith, and incorporated herein by reference. Surprisingly, diamond-like glass films in accordance with the invention allow for excellent light transmission. The present inventors found that the visible light transmission of a carbon or carbon and hydrogen system could be further improved by incorporating silicon and oxygen atoms into an amorphous diamond-like system during the deposition process. This is not possible for diamond thin films because additional components will disrupt its crystalline lattice structure.

In creating a diamond-like glass film, various additional components can be incorporated into the basic carbon or carbon and hydrogen composition. These additional components can be used to alter and enhance the properties that the diamond-like glass film imparts to the substrate. For example, it may be desirable to further enhance the barrier and surface properties.

The additional components may include one or more of hydrogen (if not already incorporated), nitrogen, fluorine, sulfur, titanium, or copper. Other additional components may also work well. The addition of hydrogen promotes the formation of tetrahedral bonds. The addition of fluorine is particularly useful in enhancing barrier and surface properties of the diamond-like glass film, including the ability to be dispersed in an incompatible matrix. The addition of nitrogen may be used to enhance resistance to oxidation and to increase electrical conductivity. The addition of sulfur can enhance adhesion. The addition of titanium tends to enhance adhesion as well as diffusion and barrier properties

B. Apparatus for Forming Diamond-Like Glass

The figures illustrate aspects of an apparatus for preparing a DLG deposited film on a substrate. FIG. 1 illustrates a system 10 for forming DLG films on a substrate. System 10 includes electrodes 12 one or both of which are powered by RF (typically only one is powered, but both may be powered such that they are 180 degrees out of phase and have what is known in the art as a push-pull configuration) and a grounded reaction chamber 14, which has a surface area greater than that of powered electrode 12. A substrate 16 is placed proximate the electrode, an ion sheath is formed around the powered electrode, and a large electric field is established across the ion sheath.

Reaction chamber 14 is pumped to remove most air, such as by means of vacuum pumps at a pumping stack connected to chamber 14 at opening 18. Aluminum is a preferred chamber material because it has a low sputter yield, which means that very little contamination of the diamond-like film occurs from the chamber surfaces. However, other suitable materials, such as graphite, copper, glass or stainless steel, may be used.

It will be noted that chamber 14 can be any means of providing a controlled environment that is capable of evacuation, containment of gas introduced after evacuation, plasma creation from the gas, ion acceleration, and film deposition. In the embodiment shown in FIGS. 1 and 2, chamber 14 has outer walls 20 that are constructed in a manner sufficient to allow for evacuation of chamber interior 22 and for containment of a fluid for plasma creation, ion acceleration, and film deposition.

Also, in the implementation shown, the substrate 16 is a long fiber that has a source spool 24 and a destination spool 26. In operation, substrate 16 travels from source spool 24, past the electrodes 12, and on to the destination spool 26. These spools 24, 26 are optionally enclosed within chamber 14, or can be outside chamber 16, as long as a low-pressure plasma may be maintained within the chamber 16. In some embodiments, such as when optical glass fibers are coated, the fibers are continuously drawn from a silica preform in a draw furnace then are fed into a plasma chamber, where the diamond-like glass film is deposited. A vacuum is maintained at the inlet and outlet of the chamber by roughing pumps (not shown) one of which is attached at locations 28 and another of which is attached at location 29.

The desired process gases are supplied from storage through an inlet tube. A stream of gas is distributed throughout the chamber. Chamber 14 is closed and partially evacuated to the extent necessary to remove species that might contaminate the diamond-like glass film. The desired gas (e.g., a carbon-containing gas) is introduced into chamber 14 at a desired flow rate, which depends on the size of the reactor and the amount of substrate in the reactor. Such flow rates must be sufficient to establish a suitable pressure at which to carry out plasma deposition, typically 0.13 Pa to 130 Pa (0.001 Torr to 1.0 Torr). For a reactor that has an inner diameter of approximately 55 cm and a height of approximately 20 cm, the flow rates are typically from about 50 to about 500 standard cubic centimeters per minute (sccm).

Plasma is generated and sustained by means of a power supply (an RF generator operating at a frequency in the range of 0.001 to 100 MHz). To obtain efficient power coupling (i.e., wherein the reflected power is a small fraction of the incident power), the impedance of the plasma load can be matched to the power supply by means of matching network including two variable capacitors and an inductor, available from RF Power Products, Kresson, N.J., as Model # AMN 3000. A description of such networks can be found in Brian Chapman, *Glow Discharge Processes*, 153 (John Wiley & Sons, New York 1980).

The RF power source powers the electrode with a typical frequency in the range of 0.01 to 50 MHz, preferably 13.56 MHz or any whole number (e.g., 1, 2, or 3) multiple thereof. This RF power is supplied to the electrode to create a carbon-rich plasma from the hydrocarbon gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line.

Upon application of RF power to the electrode, the plasma is established. In an RF plasma the powered electrode becomes negatively biased relative to the plasma. This bias is generally in the range of 100 to 1500 volts. This biasing causes ions within the carbon-rich plasma to accelerate toward the electrode to form an ion sheath. Accelerating ions form the carbon-rich film on the substrate in contact with electrode.

The depth of the ion sheath ranges from approximately 1 mm (or less) to 50 mm and depends on the type and concentration of gas used, pressure applied, and relative size of the electrodes. For example, reduced pressures will increase the size of the ion sheath as will having different sized electrodes. When the electrodes are different sizes, a larger (i.e., deeper) ion sheath will form around the smaller electrode. Generally, the larger the difference in electrode size, the larger the difference in the size of the ion sheaths. Also, increasing the voltage across the ion sheath will increase ion bombardment energy.

Deposition of the diamond-like glass film typically occurs at rates ranging from about 1 to 100 nm/second (about 10 to 1000 Angstrom per second (A/sec)), depending on conditions including pressure, power, concentration of gas, types of gases, relative size of electrodes, etc. In general, deposition rates increase with increasing power, pressure, and concentration of gas, but the rates will approach an upper limit.

Figure 2:
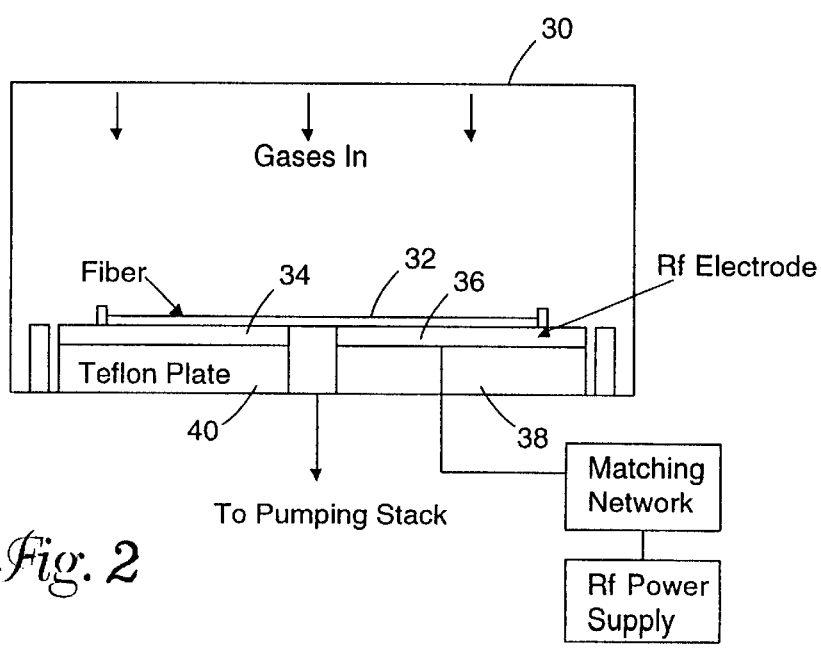
FIG. 2 is a schematic plan view of a second plasma reactor used to prepare examples of this invention.

An alternative design for an apparatus constructed in accordance with the invention is shown in FIG. 2. FIG. 2 shows a chamber from which air is removed by a pumping stack (not shown). Replacement gases to form the plasma are injected through a port in at least one wall of the chamber. A fiber substrate 32 is positioned proximate RF-powered electrodes 34, 36. Electrodes 34, 36 are insulated from the chamber 30 by Teflon supports 38, 40.

C. Methods of Depositing a Diamond-like Glass Film on the Substrate

The invention is further directed to methods of depositing a diamond-like glass onto a substrate. In specific implementations, the methods include providing a capacitively coupled reactor system having two electrodes in an evacuable reaction chamber. The chamber is partially evacuated, and radio frequency power is applied to one of the electrodes. A carbon and silicon-containing source is introduced between the electrodes to form a plasma including reactive species in proximity to the electrodes, and to also form an ion sheath proximate at least one electrode. The substrate is exposed to the reactive species within the ion sheath that is proximate an electrode to form a diamond-like glass film on the substrate.

In the method of this invention, diamond-like glass films are deposited by plasma deposition onto substrates from gases containing carbon, silicon, and optionally additional components. Deposition occurs at reduced pressures (relative to atmospheric pressure) and in a controlled environment. A carbon and silicon-rich plasma is created in the reaction chamber by applying an electric field to a carbon and silicon-containing gas. Substrates to be deposited with DLG are laid or passed adjacent to the electrode in the reactor, for example, held in a vessel or container in the reactor.

Species within the plasma react on the substrate surface to form covalent bonds, resulting in the amorphous diamond-like glass film on the surface of the substrates. A multiplicity of substrates may be simultaneously coated with DLG during the process of this invention. The substrates can be held in a vessel or container within an evacuable chamber that is capable of maintaining conditions that produce diamond-like film deposition. Alternatively, the substrate could be passed through the vacuum chamber as illustrated in FIG. 2. That is, the chamber provides an environment which allows for the control of, among other things, pressure, the flow of various inert and reactive gases, voltage supplied to the powered electrode, strength of the electric field across the ion sheath, formation of a plasma containing reactive species, intensity of ion bombardment, and rate of deposition of a diamond-like glass film from the reactive species.

Prior to the deposition process, the chamber is evacuated to the extent necessary to remove air and any impurities. Inert gases (such as argon) may be admitted into the chamber to alter pressure. Once the substrates are placed in the chamber and it is evacuated, a substance containing carbon and silicon, preferably including a carbon-containing gas, and optionally a substance from which an additional component or components can be deposited, is admitted into the chamber and, upon application of an electric field, forms a plasma from which the diamond-like glass film is deposited. At the pressures and temperatures of diamond-like film deposition (typically 0.13 to 133 Pa (0.001 to 1.0 Torr) (all pressures stated herein are gauge pressure) and less than 50° C.), the carbon and silicon-containing substances and substances from which an optional additional component may be obtained will be in their vapor form.

If hydrogen is to be included in the diamond-like glass film, hydrocarbons are particularly preferred as a source for the carbon and hydrogen, suitable hydrocarbons include acetylene, methane, butadiene, benzene, methylcyclopentadiene, pentadiene, styrene, naphthalene, and azulene. Mixtures of these hydrocarbons may also be used. Sources of silicon include silanes such as $SiH_4$, $Si_2H_6$, tetramethylsilane, and hexamethyldisiloxane. Gases containing optional additional components can also be introduced to the reaction chamber. Gases with low ionization potentials, i.e., 10 electronVolts (eV) or less, typically are used for efficient deposition of the DLG. The additional optional diamond-like glass film components, including one or more of hydrogen, nitrogen, oxygen, fluorine, sulfur, titanium, or copper, are introduced in vapor form into the reaction chamber during the deposition process. Typically, even when the sources for the additional components are solids or fluids the reduced pressure in the chamber will cause the source to volatilize. Alternatively, the additional components may be entrained in an inert gas stream. The additional components may be added to the chamber while a carbon- or hydrocarbon containing gas is sustaining the plasma and/or may be added to the chamber after the flow of carbon or hydrocarbon-containing gas has been stopped.

Sources of hydrogen include hydrocarbon gases and molecular hydrogen ($H_2$). Sources of fluorine include compounds such as carbon tetrafluoride ($CF_4$), sulfur hexafluoride ($SF_6$), perfluorobutane ($C_4F_{10}$), $C_2F_6$, $C_3F_8$, and $C_4F_{10}$. Sources of oxygen include oxygen gas ($O_2$), hydrogen peroxide ($H_2O_2$), water ($H_2O$), and ozone ($O_3$). Sources of nitrogen include nitrogen gas ($N_2$), ammonia ($NH_3$), and hydrazine ($N_2H_6$). Sources of sulfur include sulfur hexafluoride ($SF_6$), sulfur dioxide ($SO_2$), and hydrogen sulfide ($H_2S$). Sources of copper include copper acetylacetonate. Sources of titanium include titanium halides such as titanium tetrachloride.

An ion sheath is necessary to obtain ion bombardment, which, in turn, is necessary to produce a densely packed diamond-like film. An explanation of the formation of ion sheaths can be found in Brian Chapman, *Glow Discharge Processes*, 153 (John Wiley & Sons, New York 1980).

The electrodes may be the same size or different sizes. If the electrodes are different sizes, the smaller electrode will have a larger ion sheath (regardless of whether it is the grounded or powered electrode). This type of configuration is referred to as an "asymmetric" parallel plate reactor. An asymmetric configuration produces a higher voltage potential across the ion sheath surrounding the smaller electrode. Establishing a large ion sheath on one of the electrodes is preferred for this invention because the substrate is preferably located within an ion sheath to benefit from the ion bombardment effects that occur within the sheath.

Preferred electrode surface area ratios are from 2:1 to 4:1, and more preferably from 3:1 to 4:1. The ion sheath on the smaller electrode will increase as the ratio increases, but beyond a ratio of 4:1 little additional benefit is achieved. The reaction chamber itself can act as an electrode. A preferred configuration for this invention includes a powered electrode within a grounded reaction chamber that has two to three times the surface area of the powered electrode.

In an RF-generated plasma, energy is coupled into the plasma through electrons. The plasma acts as the charge carrier between the electrodes. The plasma can fill the entire reaction chamber and is typically visible as a colored cloud. The ion sheath appears as a darker area around one or both electrodes. In a parallel plate reactor using RF energy, the applied frequency should be in the range of 0.001 to 100 MHz, preferably 13.56 MHz or any whole number multiple thereof. This RF power creates a plasma from the gas (or gases) within the chamber. The RF power source can be an RF generator such as a 13.56 MHz oscillator connected to the powered electrode via a network that acts to match the impedance of the power supply with that of the transmission line and plasma load (which is usually about 50 ohms so as to effectively couple the RF power). Hence this is referred to as a matching network.

The ion sheath around the electrodes causes negative self-biasing of the electrodes relative to the plasma. In an asymmetric configuration, the negative self-bias voltage is negligible on the larger electrode and the negative bias on the smaller electrode is typically in the range of 100 to 2000 volts. While the acceptable frequency range from the RF power source may be high enough to form a large negative direct current (DC) self bias on the smaller electrode, it should not be high enough to create standing waves in the resulting plasma, which is inefficient for the deposition of a DLG film.

For planar substrates, deposition of dense diamond-like glass thin films is normally achieved in a parallel plate reactor by placing the substrates in direct contact with a powered electrode, which is made smaller than the grounded electrode. This allows the substrate to act as an electrode due to capacitive coupling between the powered electrode and the substrate. This is described in M. M. David, et al., *Plasma Deposition and Etching of Diamond-Like Carbon Films*, AIChE Journal, vol. 37, No. 3, p. 367 (1991), incorporated herein by reference. In the case of an elongate substrate, the substrate is optionally continuously pulled through the chamber, passing proximate the electrode with the largest ion sheath, while a continuous RF field is placed on the electrode and sufficient carbon-containing gas is present within the chamber. A vacuum is maintained at the inlet and exit of the chamber by two roughing pumps (not shown), one of which is attached at locations 28 and the other of which is attached at location 29. The result is a continuous DLG film on an elongated substrate, and substantially only on the substrate.

In the foregoing description, certain terms have been used for brevity, clarity, and understanding. No unnecessary limitations are to be implied therefrom beyond the requirement of the prior art because such terms are used for descriptive purpose and are intended to be broadly construed. Moreover, the description and illustration of the invention is by way of example, and the scope of the invention is not limited to the exact details shown or described.

Diamond-like glass may also be deposited on particles, using an apparatus and method similar to those described in U.S. patent application Ser. Nos. 08/979,072 and 08/978,716, both of which are incorporated herein by reference wherein, in some implementations, the coating apparati expose the particles to the plasma by generating a fluidized bed of the particles. The diamond-like glass may be especially useful on particles having at least one oxide film, such as those disclosed in U.S. application Ser. No. 08/978,716

D. Example

This invention may be illustrated by way of the following examples, including the test methods used to evaluate and characterize the DLG films produced in the examples.
Hydrophilicity The hydrophilic nature of modified DLG thin films was determined by placing a drop of de-ionized water on the sample surface and measuring the contact angle at the air/substrate/water meniscus in stationary mode.
Plasma Reactor Descriptions Reactor One: Diamond-like glass (DLG) films were deposited in a home-built plasma reactor designed specifically for deposit on fibers and schematically illustrated in FIG. 1. It includes a vertical aluminum chamber having two linear aluminum electrodes that are nominally 610 mm (24 inches) long and 38 mm (1.5 inches) wide, located along the linear axis of the chamber, one above the other in a staggered arrangement, i.e., not vertically aligned. The sides and backside of the electrode are insulated with polyetherimide, available under the trade name ULTEM from Union Carbide, and capped off with a ground plane made of aluminum so that only the front side of the electrode is actively exposed to the plasma. The electrodes are powered by a 1.25 kW RF power supply that was operated at a frequency of 13.56 MHz (Model CX1250 from Comdel Inc., Beverly, Mass.) and matching network (Model CPM-1000 from Comdel Inc.) and controller (Model MatchPro CPM from Comdel Inc.). The feed gas or mixture of gases was introduced into the deposition chamber through mass flow controllers (from MKS Instruments, Andover, Mass.) and was pumped by a roots blower (Model EH1200 from Edwards High Vacuum, Sussex, England) backed by a mechanical pump (Model E2M80 from Edwards High Vacuum). Pressure in the chamber was measured by a capacitance manometer and controlled by a throttle valve and controller (Models 653 and 600 series, respectively, from MKS Instruments). The fiber substrates were passed from atmospheric conditions into the chamber through differentially pumped orifice plates. Roughing pumps were used to maintain a vacuum at the entrance and exit of the vacuum chamber.

Reactor Two: A commercial parallel-plate capacitively coupled plasma reactor (commercially available as Model 2480 from PlasmaTherm of St. Petersburg, Fla.) was modified and used for the deposition of DLG onto capillary tubes. This reactor, schematically illustrated in FIG. 2, includes a grounded chamber electrode containing a powered electrode. The chamber is cylindrical in shape with an internal diameter of 26 inches and height of 12 inches. A circular electrode having a diameter of 55.9 cm (22 inches) was mounted inside and attached to a matching network and a 3 kW RF power supply that was operated at a frequency of 13.56 MHz. The chamber was pumped by a roots blower backed by a mechanical pump. Unless otherwise stated, the base pressure in the chamber was 0.67 Pa (5 mTorr). Process gases were metered into the chamber either through a mass flow controllers or a needle valve. All the plasma depositions and treatments were done with the substrate located on the powered electrode of the plasma reactor.

Example 1

This example illustrates the effect of feed gas chemistry on the optical properties and composition of DLG thin films.

Both silicon wafers and quartz slides were mounted to the powered electrode of Plasma Reactor One with adhesive backed tape. The chamber was pumped down. to its base pressure of nominally 10 mTorr and the substrate surfaces were cleaned in an oxygen plasma. During the oxygen plasma cleaning step, the gas flow rate, ressure, and RF power were maintained at 100 sccm, 100 mTorr, and 200 Watts, espectively. The plasma cleaning was carried out for 10 seconds.

After cleaning, one of four different chemical compositions (Samples A–D) as deposited on the silicon and quartz substrates with a second plasma. For Sample A, the second plasma was formed from a mixture of tetramethylsilane (TMS, available as a liquid from Aldrich Chemical Company, Milwaukee, Wis.) and oxygen (available in gas cylinders from Oxygen Service Company, Minneapolis, Minn.). The flow rate of TMS and oxygen were 150 standard cubic centimeters (sccm) and 10 sccm, respectively, to result in a ratio of TMS to $O_2$ of 15. For Samples B–D, the flow rate of the oxygen was varied to result in a ratio of TMS to oxygen of 3.75, 2.14 and 1.5, respectively. The pressure and RF power were maintained for all samples at 40 Pa (300 mTorr) and 200 Watts, respectively. The plasma was pulsed at a frequency and duty cycle, i.e., the percent of time the power supply is on,of 10 Hz and 90%, respectively. The deposition time was varied to yield nominally 0.1 micron thick films on silicon and 1 micron thick films on quartz for each sample.

Figure 3:
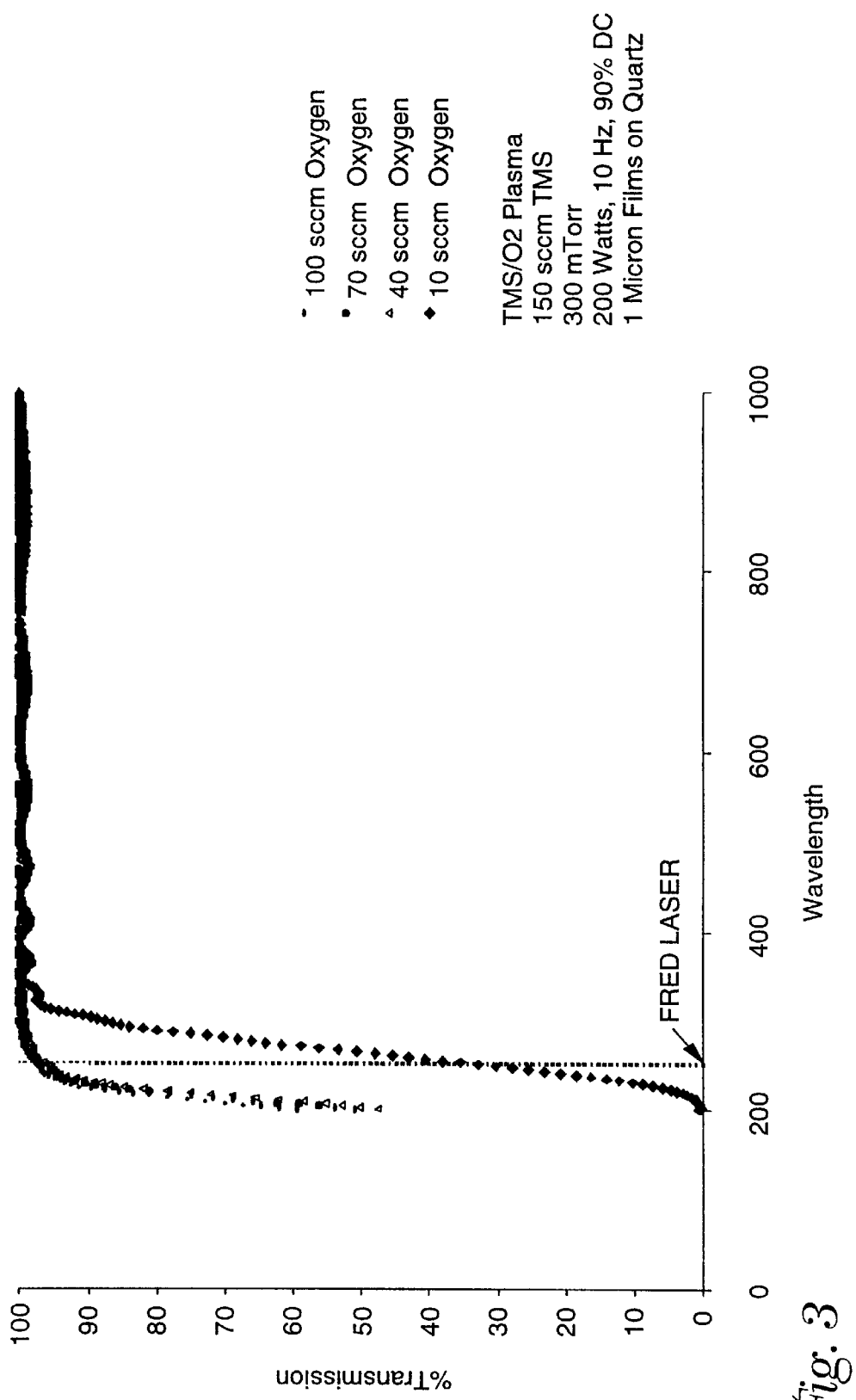
FIG. 3 is transmission spectra of diamond-like glass thin films as prepared in example 1.
Figure 4:
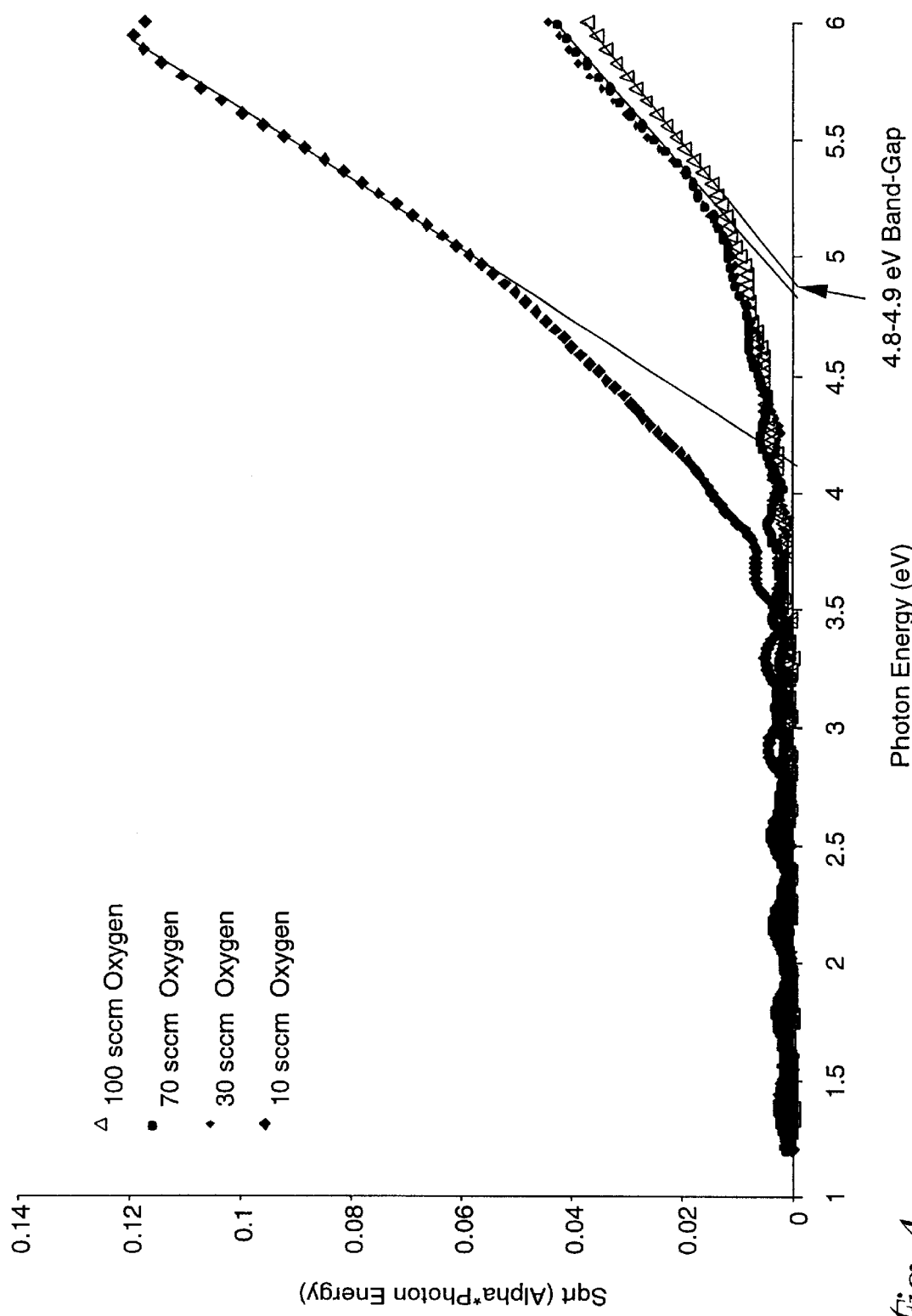
FIG. 4 is the band gap of diamond-like glass thin films as prepared in example 1.
Figure 5:
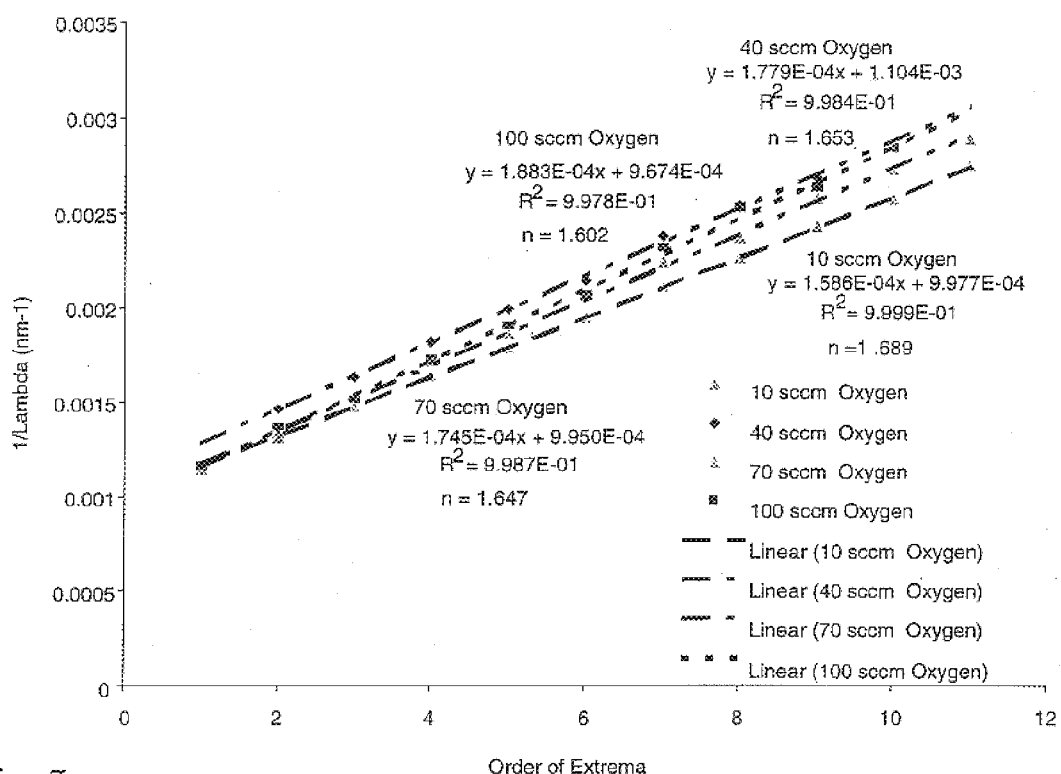
FIG. 5 is a plot of the refractive indices of diamond-like glass thin films as prepared in example 1.

Optical transmission, optical band-gap width, and refraction index were measured on or calculated for the DLG films that were deposited onto the quartz slides. Transmission spectra of the samples, measured on a Model Lambda 900 Spectrophotometer available from Perkin Elmer Corporation, Norwalk, Conn., are illustrated in FIG. 3. As seen, the films were completely (100%) transparent in the visible region of the spectrum whereas the UV absorption increased abruptly as the TMS/oxygen ratio increased beyond 4. The optical band-gap width was determined by the Tauc procedure in which the square-root of (absorption x photon energy) was graphed as a function of the photon energy. This is shown in FIG. 4 and the intercept was read and found to vary from about 4 to about 5 eV depending upon the oxygen flow rate during deposition. The refractive index was calculated by peak analysis of the extrema in transmission spectra shown in FIG. 3. The summary results of this peak analysis are shown in FIG. 5. The refractive indices were calculated from the slopes of the straight lines and thickness values of the DLG thin films measured by using a Tencor stylus profilometer. As seen in FIG. 5, the refractive index varies from about 1.6 to about 1.69 depending on the feed gas composition.

The compositions of the DLG thin film samples were determined by x-ray photoelectron spectroscopy (XPS) using a Kratos AXIS Ultra system. In XPS, a focused x-ray beam irradiates the sample producing photoelectrons that are then characterized by their energy and intensity. The energies of the photoelectrons are specific to particular elements and their chemical states. XPS spectra were acquired as received then again after each time they were sputter etched with a 5 kV argon ion beam at approximately 5 nm intervals. The average composition for each sample, on a hydrogen free basis, of atomic percent carbon, atomic percent silicon, and atomic percent oxygen are shown in Table 1. A depth profile was also acquired by Auger electron spectroscopy, which confirmed that the composition was uniform through the depth of the film.

Figure 6:
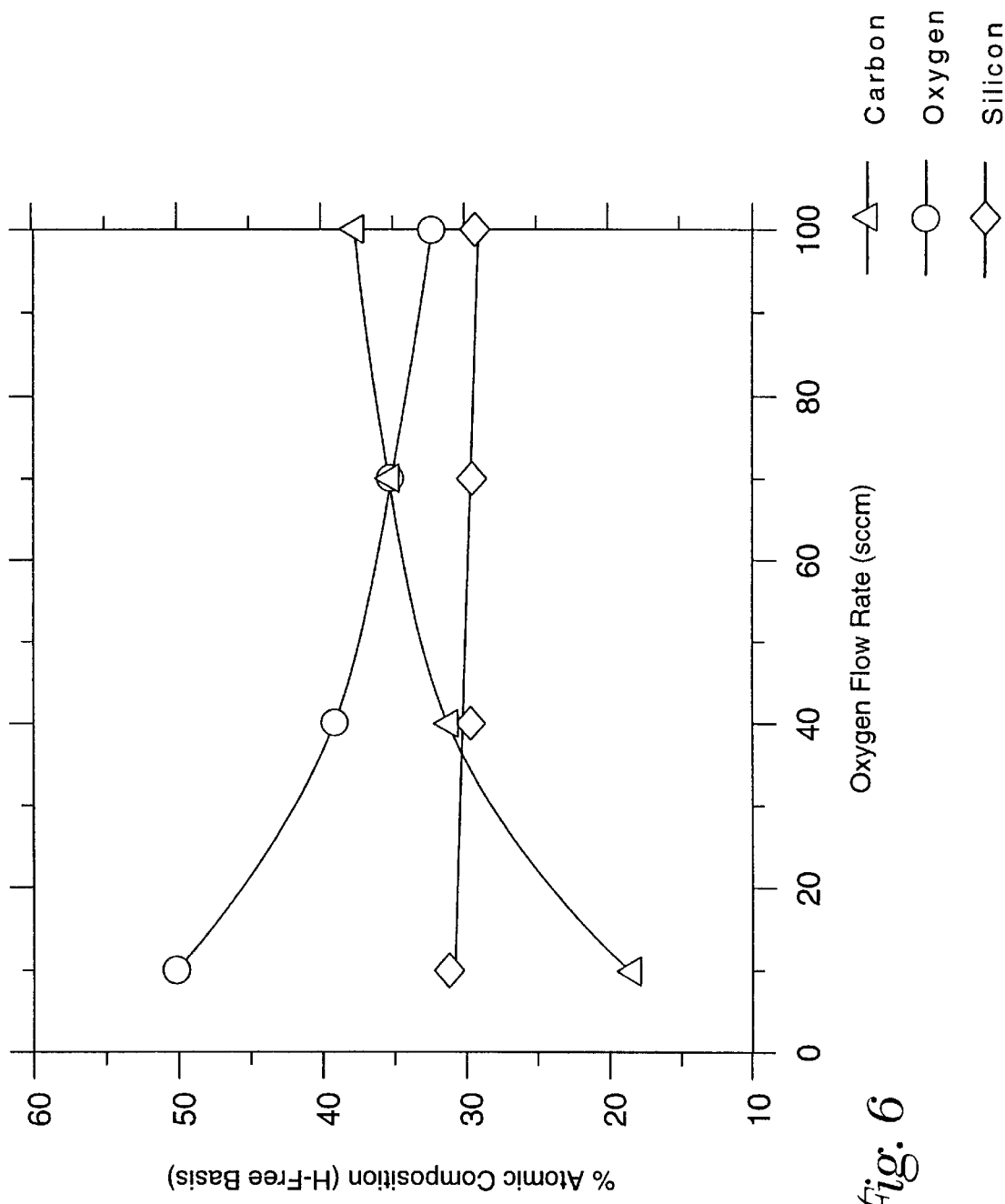
FIG. 6 is a plot of composition changes of diamond-like glass thin films as prepared in example 1.

The data from this table is also shown in FIG. 6, which shows the trends in composition with changing feed gas ratio. FIG. 6 reveals monotonic, i.e., gradual, changes in the composition of the resulting films. This would be expected in a random covalent system in which monotonic changes in elemental composition are possible.

TABLE 1

| Sample | TMS/Oxygen Ratio | Carbon Atomic percent | Silicon Atomic percent | Oxygen Atomic percent |
|---|---|---|---|---|
| A | 15 | 50.2 | 31.2 | 18.6 |
| B | 3.75 | 39.2 | 29.7 | 31.3 |
| C | 2.14 | 35.2 | 29.6 | 35.4 |
| D | 1.5 | 32.4 | 29.4 | 37.8 |

Example 2

This example illustrates the effect of a low concentration ratio of tetramethyl silane (TMS) to oxygen on the write-through property of diamond-like glass (DLG) thin films.

Acrylate-coated optical fibers (pure silica clad with optical core, the optical core being the most inner portion of the glass fiber and is made to have a higher refractive index by doping with germanium so the total internal reflection can occur to function as an optical fiber), having a nominal core diameter of 5 to 10 $\mu$m, a cladding diameter of 125 $\mu$m, and an acrylate coating diameter of 250 $\mu$m, available as Part No. CS-96-0110 from 3M Company—Optical Transport Systems, West Haven, Conn.) were stripped of their acrylate coating by dipping a 6 cm section of a long length of fiber sequentially into fuming sulfuric acid (at 175° C.), water and methanol that were poured into three separate beakers. The section of fiber was in each liquid for about 30 seconds. The sectionally stripped fibers were mounted to a sample holder with the stripped section located in free-span and thus not making mechanical contact to any other surface. The sample holder was mounted against the powered electrode of Plasma Reactor One. The surface of the fiber facing away from the electrode was pre-cleaned by using an oxygen plasma at 13.3 Pa (100 mTorr) and 400 Watts for 15 seconds. After cleaning the first side, the chamber was opened, the holder was flipped around, the chamber was closed and the other side of the fiber was similarly pre-cleaned. After oxygen plasma cleaning, DLG films were deposited on the surface of the fibers by exposing each side of the fiber to a second plasma for 10 minutes. The second plasma was formed from a mixture of TMS and oxygen. The pressure and RF power were maintained at 20 Pa (150 mTorr) and 200 Watts, respectively. The flow rate of TMS and oxygen were 150 standard cubic centimeters (sccm) and 750 sccm, respectively, to result in a ratio of TMS to $O_2$ of 0.2. The second plasma treatment resulted in a DLG film with a thickness of 5 microns. A similar DLG film having a thickness of 1.0 micron was also deposited on one side of an oxygen plasma cleaned quartz slide for subsequent transmission testing.

Figure 7:
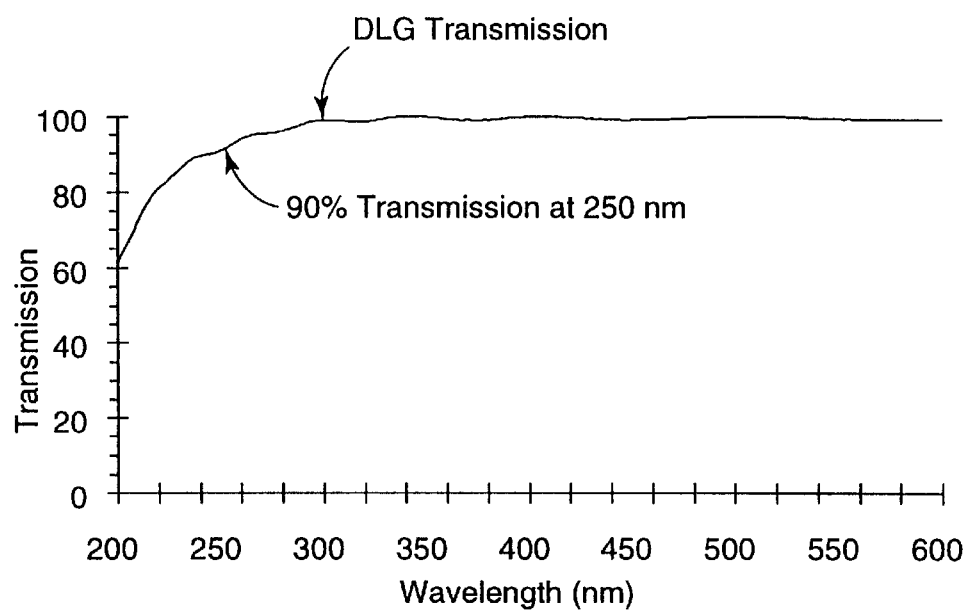
FIG. 7 is transmission spectrum of an optical glass fiber deposited with a diamond-like glass thin film as prepared in example 2.

Optical transmission of the DLG film was measured on the films that were deposited onto the quartz slide. Transmission spectra were measured on a Lambda 900 Spectrophotometer. As seen in FIG. 7, the transmission was essentially water-clear with a transmission of 90% at 250 nanometers (nm).

Figure 8:
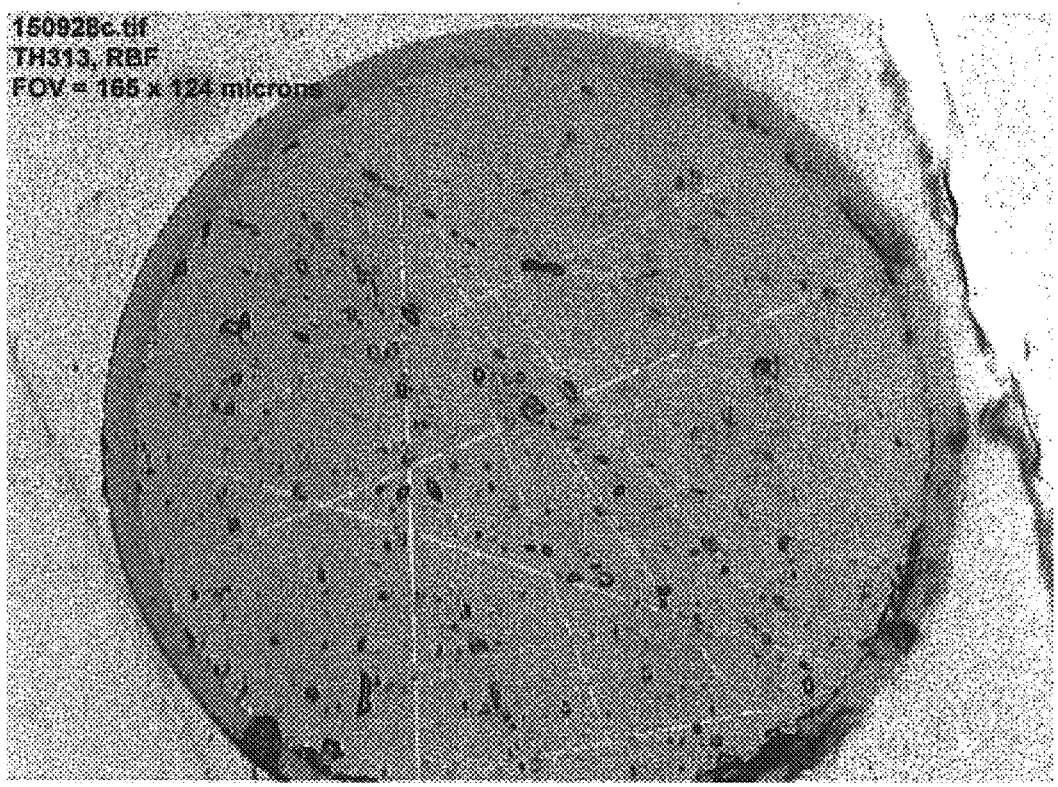
FIG. 8 is a digital image cross-sectional optical micrograph at a magnification of about 760× of an optical glass fiber deposited with a diamond-like glass thin film as prepared in example 2.

Thickness of the DLG thin film on the fiber was measured with an electron microscope. The thickness was 5.0 microns. The uniformity and concentricity of the thin film are shown in FIG. 8.

Figure 9:
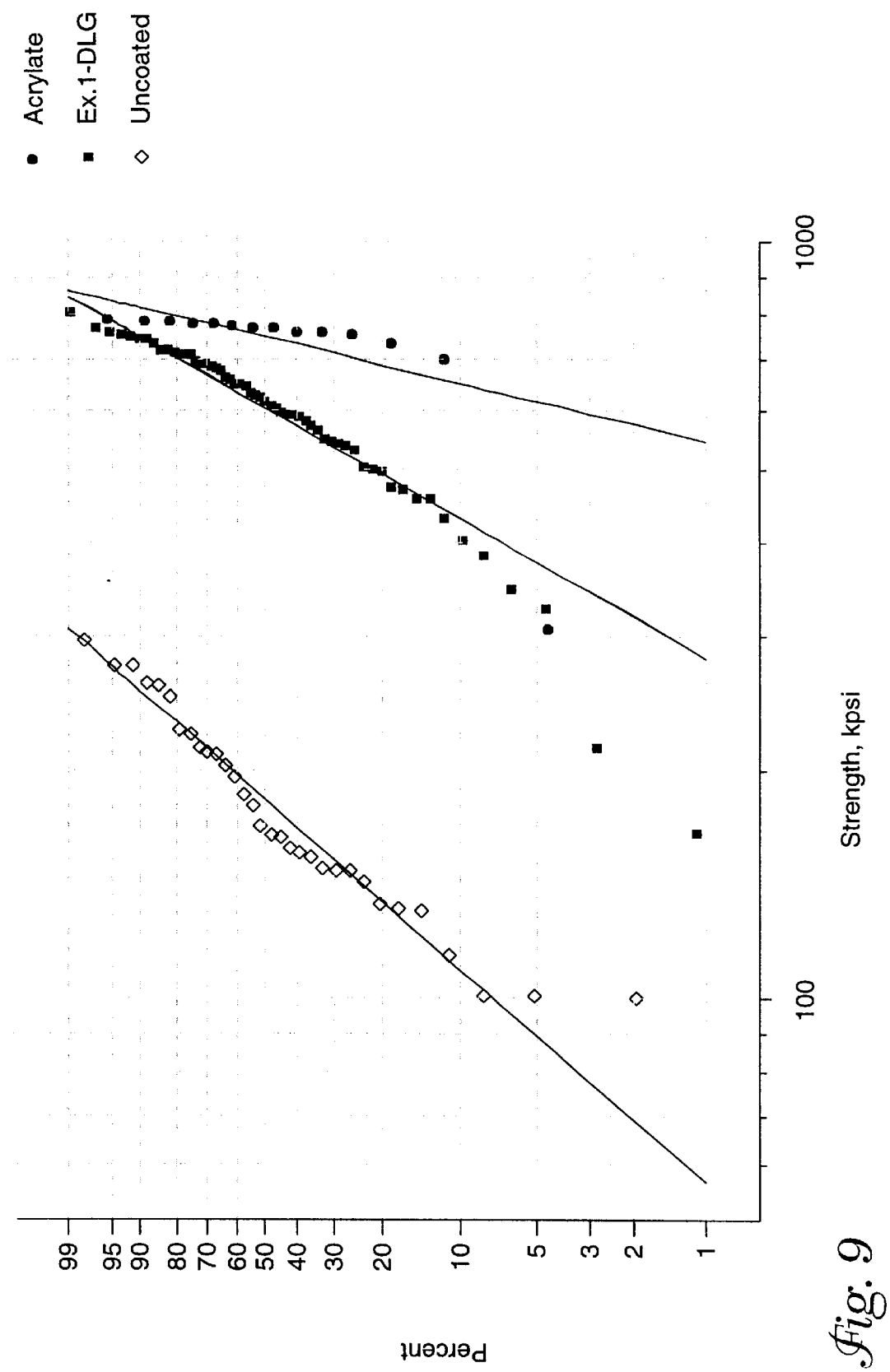
FIG. 9 is a Weibull plot comparing the strengths of optical glass fibers that are uncoated, coated with acrylate, and deposited with diamond-like glass thin films as prepared in example 2.

Mechanical properties of the thin film covered fibers were then compared with those of both the original acrylate-coated fibers and the stripped fibers. The DLG-deposited fibers, like the acrylate-coated fibers, appeared insensitive to handling such as by wiping the fibers between fingers or wrapping them on mandrels having 2 inch diameters. In contrast, stripped fibers easily broke under such handling. All three fibers were pull-tested in a Vytran proof tester (Model PTR-100, available from Vytran Corporation, Morganville, N.J.). As seen in FIG. 9, the probability of fracture for both the acrylate-coated and DLG-deposited fibers occurred at higher tensile forces than that for stripped fibers.

The DLG deposited fiber was exposed to hydrogen gas at elevated an temperature and pressure to permit the hydrogen to diffuse into the photosensitive region of the fiber to increase the fiber's photosensitivity (a detailed description of the effects of hydrogen may be found in Raman Kashap, Fiber Bragg Gratings, Academic Press, San Diego (1999) and maintained at approximately −45° C. until a Bragg grating was written. The gratings were written using an excimer laser Lambda Physik (LPX210) and an interferometric writing method. The energy density was 26 mJ/cm$^2$ per pulse at 50 Hz repetition rate, corresponding to 240 mW in a spot approximately 9 mm (along fiber axis) by 2 mm. All DLG data were compared to data from stripped fiber taken on the same day to account for any variations in the interferometer system and to identify any effects from the DLG treatment.

Figure 10:
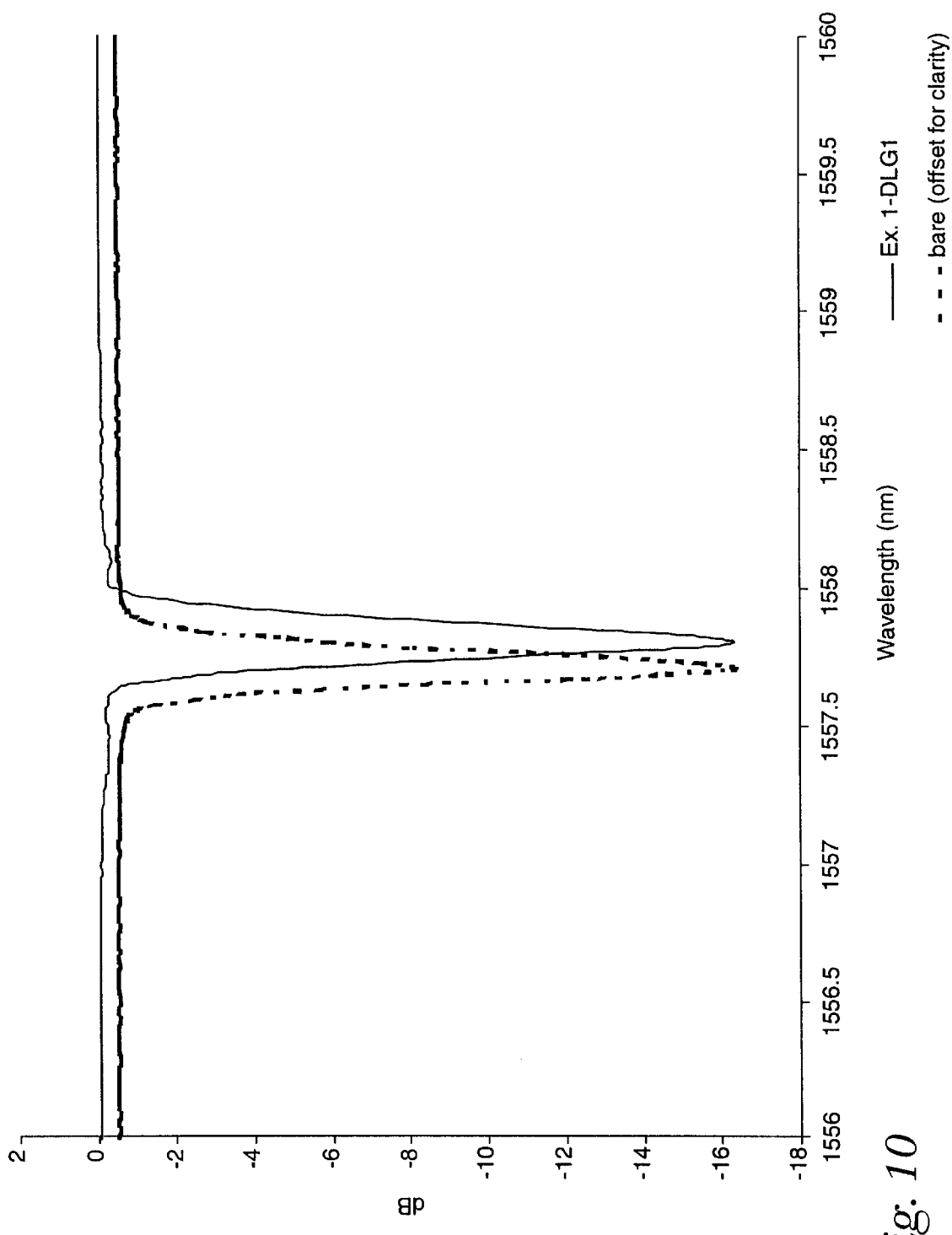
FIG. 10 is transmission spectrum of gratings written on optical glass fibers deposited with diamond-like glass thin films as prepared in example 2.

Within experimental error, the results form the DLG samples were indistinguishable from the bare fiber samples. As seen in FIG. 10, the grating spectrum for a DLG sample was similar to that of a stripped fiber. In contrast, the standard acrylate coating on the fiber was severely damaged under exposure to the excimer laser, and did not transmit the UV wavelengths.

Example 3

This example illustrates the effect of a higher concentration ratio of TMS to oxygen on the write-through property of DLG thin films.

DLG thin films were deposited onto stripped optical fibers as in Example 2 except the flow rates of the input gases for the second plasma and the chamber pressure were changed. The flow rates of TMS and oxygen were 150 sccm and 100 sccm, respectively resulting in a ratio of TMS to oxygen of 1.5. The pressure was maintained at 40 Pa (300 mTorr). Furthermore, the RF power was pulsed at a frequency and duty cycle of 10 Hz and 90% respectively. A similar thin film, 0.1 µm thick, was deposited onto a silicon plate for subsequent determination of composition.

The composition of the DLG thin film was determined by XPS as in Example 1. The average composition, on a hydrogen free basis, was 33 atomic percent carbon, 29 atomic percent silicon, and 38 atomic percent oxygen. A depth profile was also acquired by Auger electron spectroscopy, which confirmed that the composition was uniform through the film's depth.

Figure 11:
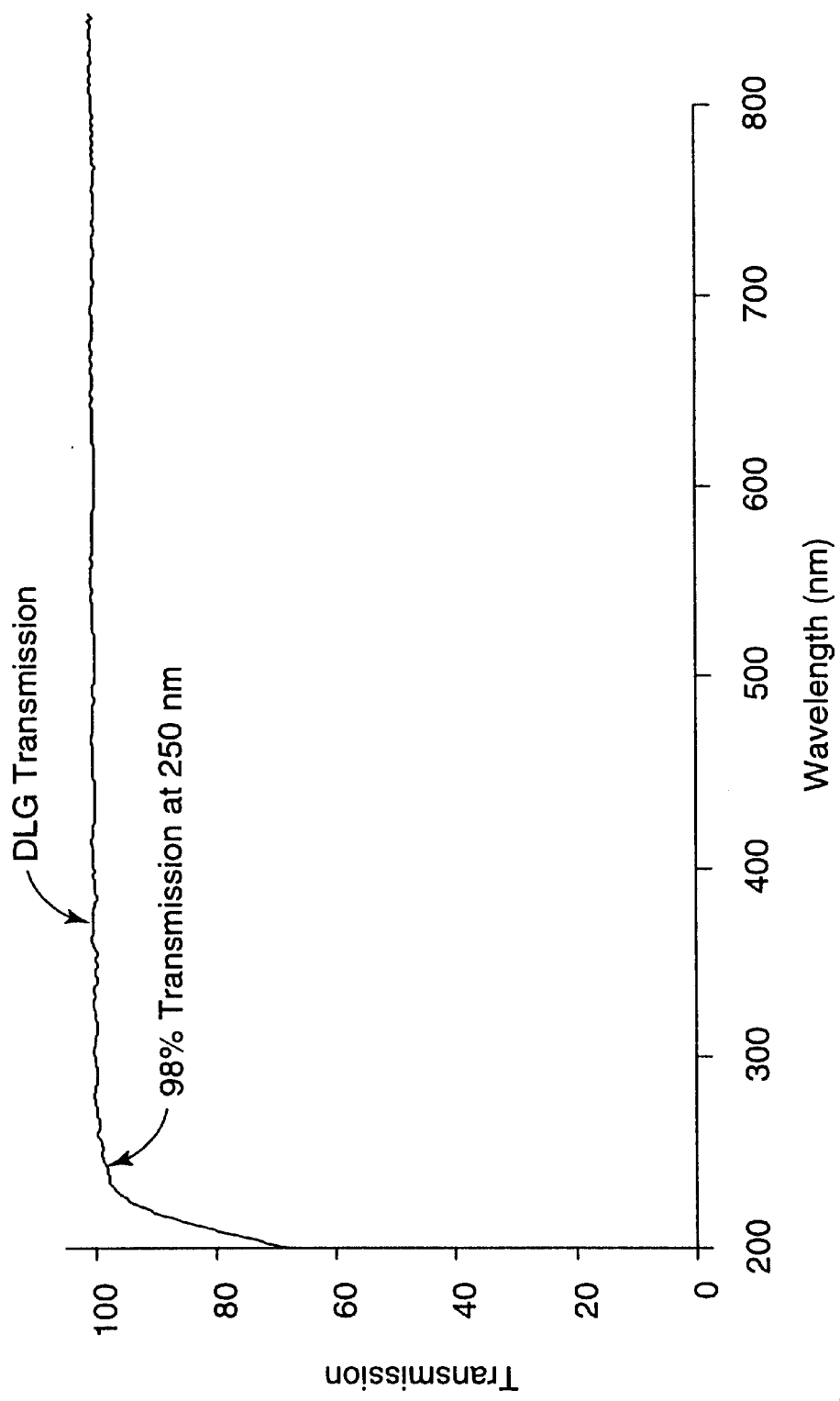
FIG. 11 is transmission spectrum of an optical glass fiber deposited with a diamond-like glass thin film as prepared in example 3.
Figure 12:
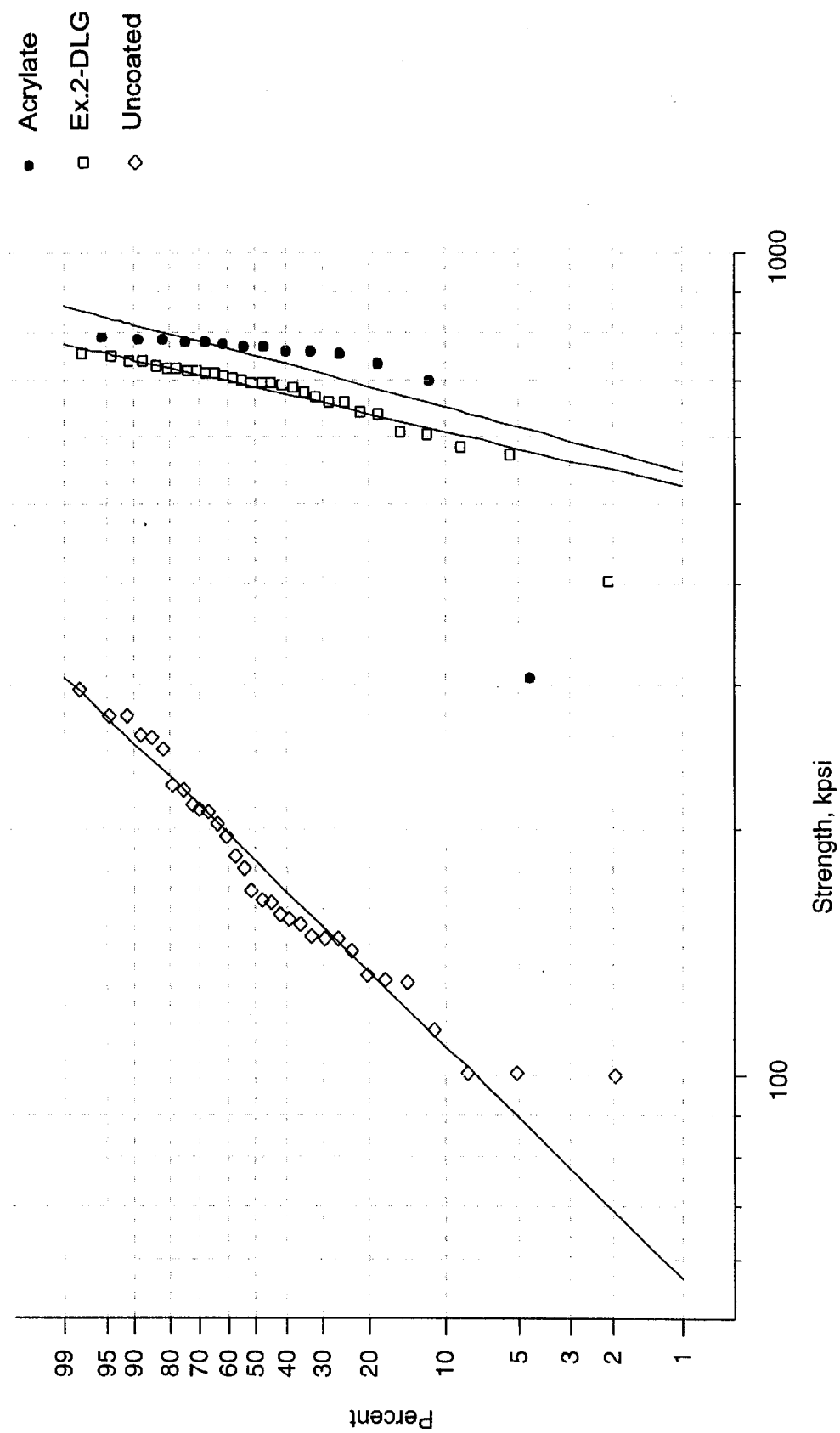
FIG. 12 is a Weibull plot comparing the strengths of optical glass fibers that are uncoated, coated with acrylate, and deposited with diamond-like carbon thin films as prepared in example 3.

The transmission of the DLG thin film of Example 3 was even greater than that of Example 2. As shown on FIG. 11, transmission at 250 nanometers was 98 percent. Mechanical properties were measured by determining the mean strength at 50% probability of failure when measured according to Electronic Industries Association (EIA) Standard Test Procedure Fiber Optics Test Procedure FOTP-28. Likewise, the mechanical properties of the DLG thin film of Example 3 were improved over those of Example 2. A Weibull plot for Example 3 is shown in FIG. 12. A Weibull plot is a plot of the breaking strengths of a statistical sample of optical fibers and it can be used to predict operating lifetimes under a given stress condition. Weibull plots are discussed in American National Standard Institute EIA/TIA Standard Fiber Optic Test Procedure FOTP-28, and references therein. See also 3M Technical Publication: Fredrick Bacon, "Silica Optical Fibers—Application Note" at page 3, available from 3M Optical Transport Systems, West Haven, Conn.

Figure 13:
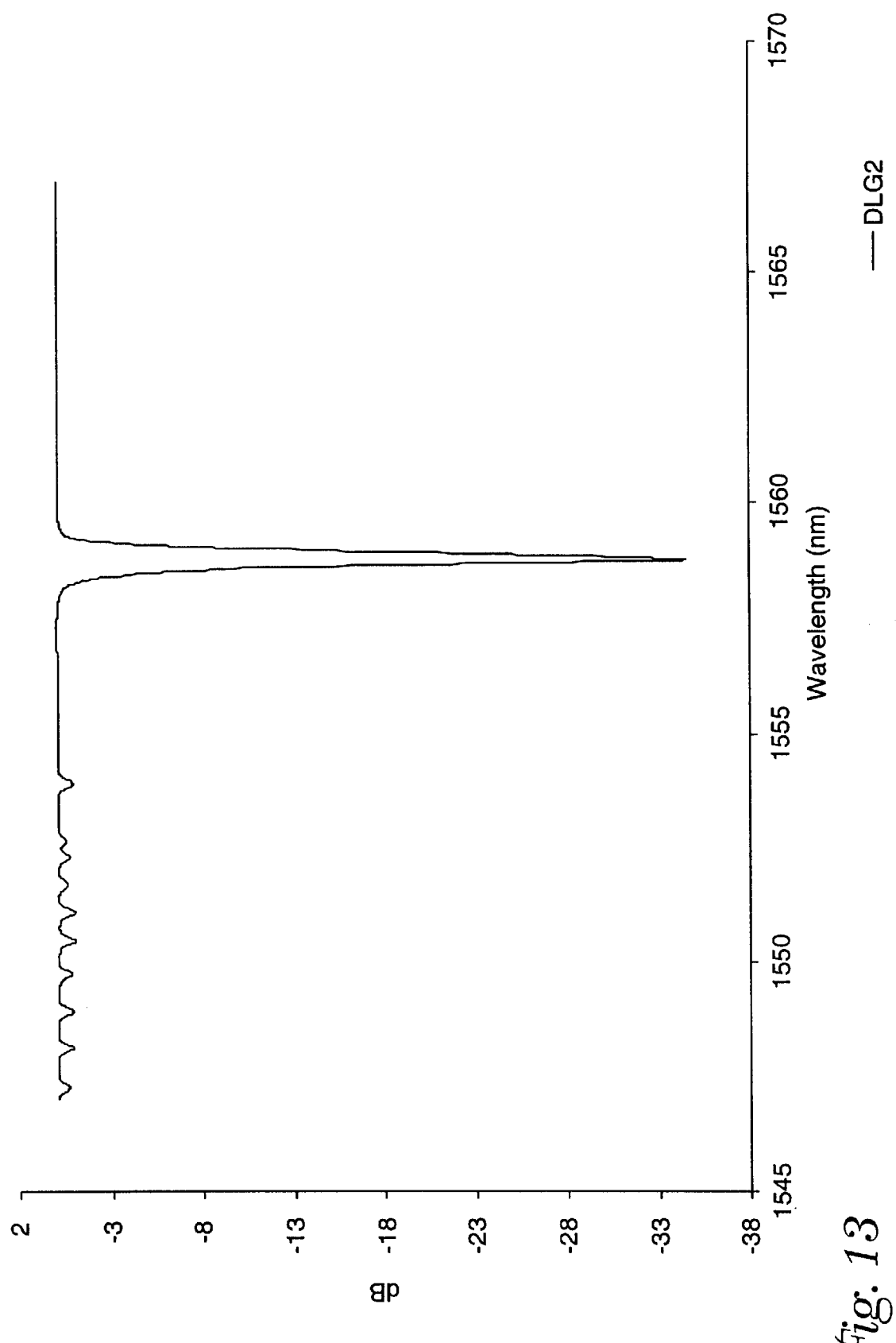
FIG. 13 is a grating transmission spectrum written on optical glass fibers deposited with diamond-like glass thin films as prepared in example 3.

The Bragg grating writing for Example 3 was similar to that of Example 2. FIG. 9 shows the grating transmission spectra for the DLG-coated fiber of Example 3. As shown by the similarity in transmission spectra, the presence of the DLG film had no adverse effect when compared to the stripped fiber. The comparison with the bare fiber spectrum in FIG. 13 is not exact because the gratings were written under slightly different conditions. The grating procedure was conducted for a longer period of time, resulting in deeper (higher decibel value) gratings for the DLG-protected fiber.

Example 4

This example illustrates the relationship between several process variables (TMS/Oxygen Ratio, pressure and power) and several properties (Growth Rate, % Transmission and mechanical strength of the thin film deposited fibers). Growth rate measurements were made by measuring the step height of the diamond-like films on glass slides using a stylus profilometer (Model Alpha Step 500, Tencor Instruments, Mountainview, Calif.).

Samples 4A to 4L were made as Example 2 except the TMS/Oxygen ratio, pressure and RF power were varied as listed in Table 2.

Transmission spectra, growth rate of the film and Weibull plot were determined as in Example 2 for each sample. Transmission was essentially 100% in the visible region of the spectrum with the transmission dropping off in the UV range. Transmission (T) values at 250 nm are shown in Table 2. Growth rate varied with process conditions in the range of 20–60 Angstrom/s. The mean Weibull strength was calculated from pull test measurements on three different fiber samples per condition. Both the growth rates and mean Weibull strength are shown in Table 2. Within experimental error, the mean strength of the fibers is not a function of the process conditions.

TABLE 2

| Ex. | TMS/O2 Ratio | Pressure (Pa) | Power (Watts) | Gr. Rate (A/s) | % T at 250 nm | Strength (kpsi) |
| --- | --- | --- | --- | --- | --- | --- |
| 4A | 1.2 | 250 | 150 | 26.8 | 98.0 | 740 |
| 4B | 1.8 | 250 | 150 | 24.4 | 98.5 | 464 |
| 4C | 1.2 | 350 | 150 | 29.0 | 99.1 | 739 |
| 4D | 1.8 | 350 | 150 | 26.6 | 99.2 | 772 |
| 4E | 1.2 | 250 | 250 | 52 | 91.5 | 732 |
| 4F | 1.8 | 250 | 250 | 47.4 | 92.6 | 568 |
| 4G | 1.2 | 350 | 250 | 54.1 | 94.8 | 580 |
| 4H | 1.8 | 350 | 250 | 50.3 | 96.1 | 636 |
| 4I | 1.5 | 300 | 200 | 39.1 | 98.1 | 796 |
| 4J | 1.5 | 300 | 200 | 37.5 | 96.3 | 610 |
| 4K | 1.5 | 300 | 200 | 37.6 | 98.0 | 719 |
| 4L | 1.5 | 300 | 200 | 42.2 | 96.7 | 421 |

The results from Table 2 demonstrate the robustness of the DLG thin films even though the conditions used to prepare them were varied over a wide range.

Example 5

This example illustrates the strength properties of DLG thin films in a biofluidic application involving glass capillaries.

Figure 14:
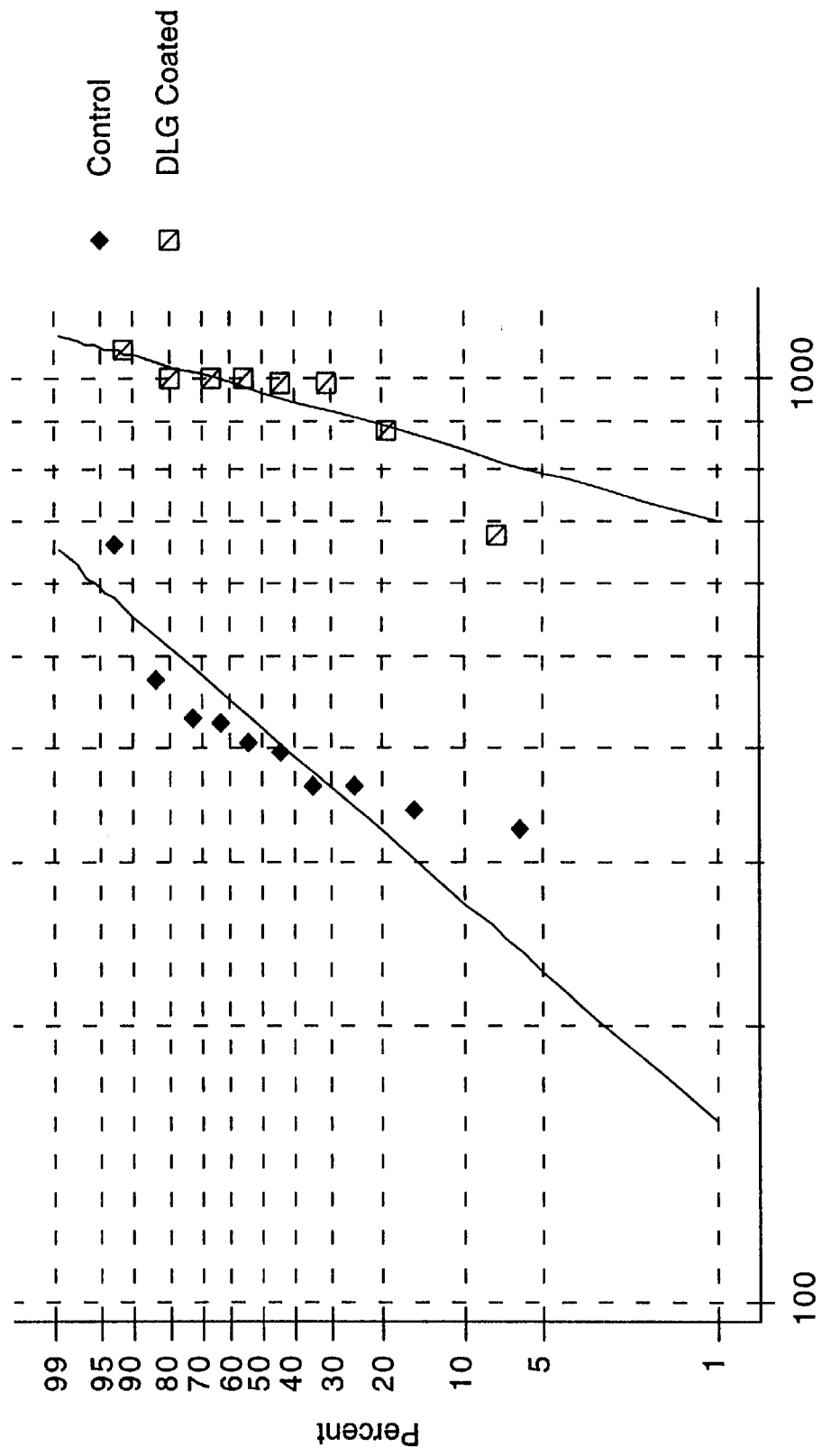
FIG. 14 is a Weibull plot comparing the strengths of glass capillaries that are uncoated, coated with acrylate, and deposited with diamond-like glass thin films as prepared in example 5.

Example 5 was made as Example 3 except different substrates were used. The substrates were experimental acrylate coated glass capillaries composed of pure silica glass, drawn from a silica tube, to a capillary with an outside diameter of 200 microns and an inside diameter of 50 microns. As part of the draw process, the silica capillary is coated with an acrylated urethane to a diameter of 300 microns. Mechanical strength of the capillaries was tested using a Vytran proof tester. In order to simulate mechanical handling, the acid stripped section was wiped once with fingers, the capillaries pulled to failure and the ultimate strength recorded. In the case where the maximum load was inadequate to break the capillaries, the maximum load was recorded and the actual strength of the capillaries is higher than the recorded value. The mechanical strength results are summarized in FIG. 14, demonstrating improved strength of the treated capillaries.

Figure 15:
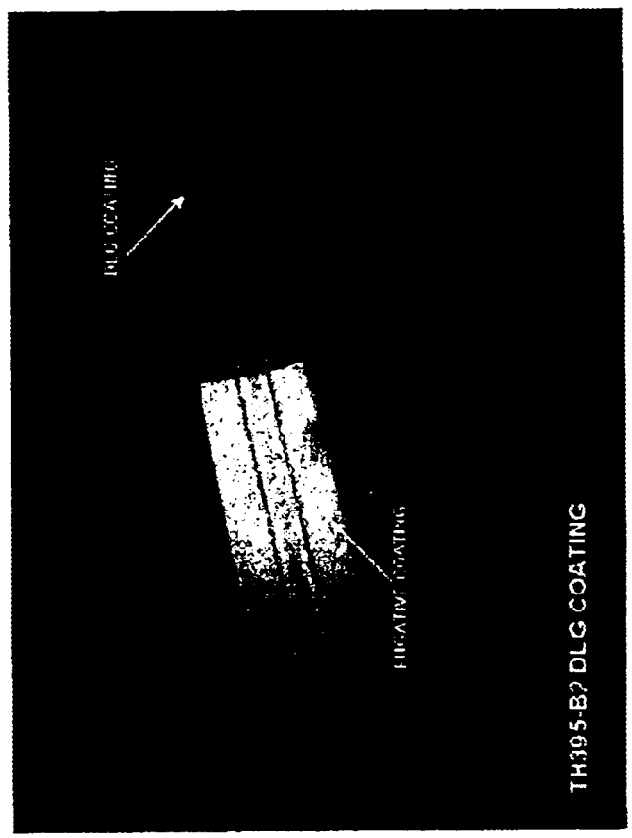
FIG. 15 is a fluorescence digital image micrograph of a glass capillary, half of which is coated with an acrylate coating (identified as Fugative Coating) and half of which is encapsulated with a diamond-like glass thin film, as prepared in example 5.

The efficacy of the DLG encapsulated glass capillary for capillary electrophoresis was demonstrated by a lack of fluorescence when imaged in a fluorescence microscope. FIG. 15 shows a fluorescence micrograph of a capillary with a conventional acrylate coating and a DLG encapsulated capillary. A dramatic difference in the intensity of fluorescence may be seen, with the DLG encapsulated fiber displaying little if any fluorescence.

Figure 16:
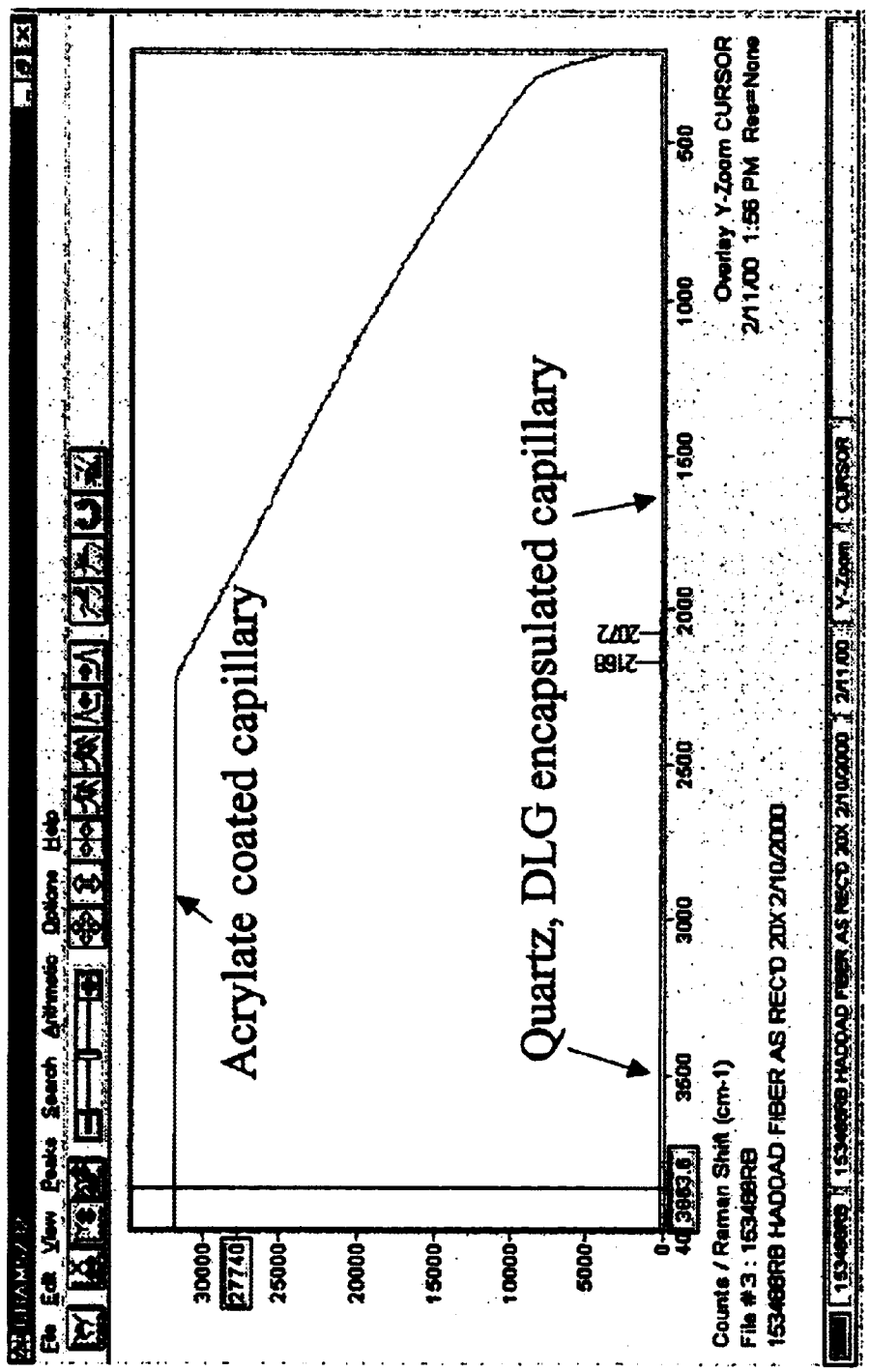
FIG. 16 is a fluorescence spectrum of aglass capillary either coated with an acrylate coating or encapsulated with diamond-like glass thin films as prepared in example 5.

The benefit of the DLG encapsulated capillaries was further quantified by making fluorescence measurements with a Raman spectrometer. The samples were all analyzed using the Renishaw system 1000 Raman. The laser excitation was with an Argon Ion laser operating at 488 nm. A 20× objective was used and a single scan was taken on each sample. In addition to the DLG encapsulated capillaries, a bare quartz substrate and acrylate encapsulated capillaries were also evaluated for comparison. The results are summarized in FIG. 16. As seen, the magnitude of fluorescence is less than 200 counts for both DLG encapsulated and bare quartz above 3,000 $cm^{-1}$ whereas it is higher than 30,000 counts for the acrylate coated capillary.

Example 6

This example illustrates a shrink film application of DLG thin films.

Four DLG deposited heat shrink films, Samples A–D, were prepared using Reactor Two. To apply the DLG films, samples were mounted on a 22-inch circular electrode powered by a 3 kWatt RF power supply and matching network operating at a frequency of 13.56 Mhz. The system was pumped by a 5.4 $m^3$/min (200 cfm) roots blower backed by a mechanical pump to a base pressure of less than 10 mTorr before starting the runs. Plasma treatment was done in three steps in all the runs. The flow rate of the process gases was maintained with either a needle valve or a mass flow controller. Chamber pressure was measured with a capacitance manometer.

In the first step of the plasma treatment, surfaces of samples of 1-mil heat shrink polyethylene film (available as Cyrovac D955 from Sealed Air Corporation, Saddle Brook, N.J.) were mounted on the circular powered electrode. They were then primed with a pure oxygen plasma to generate surface free radicals to enable good bonding to the DLG layer. Oxygen flow rate, pressure and RF power for each sample was about 750 sccm, from about 152 to about 167 mTorr, and 500 Watts, respectively. The exposure time was 30 seconds for Sample A and 60 seconds for Sample B–D. In the second step, a DLG layer was deposited onto each primed surface. For all four samples, DLG thin films were formed through plasma deposition by feeding a mixture of tetramethylsilane (TMS) and oxygen at flow rates, pressures and RF power as indicated in Table 3. Exposure times and resulting film thickness are also listed in Table 3. Finally, in the third step, the deposited DLG thin film for Sample A–D were treated in an oxygen plasma to remove elemental and covalently bonded carbon from the surface atomic layers. This makes the surface hydrophilic because only silicon and oxygen then remain in the surface layer. The oxygen flow rate, pressure and RF power were similar to that used in the first step and the exposure time was at least 2 minutes for each sample.

TABLE 3

| Example | TMS/oxygen (sccm/sccm) | Pressure (mTorr) | Power (Watts) | Time (seconds) | Thickness (Angstroms) |
|---|---|---|---|---|---|
| A | 30/750 | 172 | 500 | 15 | 250 |
| B | 30/750 | 176 | 500 | 30 | 500 |
| C | 30/750 | 174 | 500 | 67 | 1000 |
| D | 30/750 | 180 | 500 | 300 | 5000 |

Figure 17:
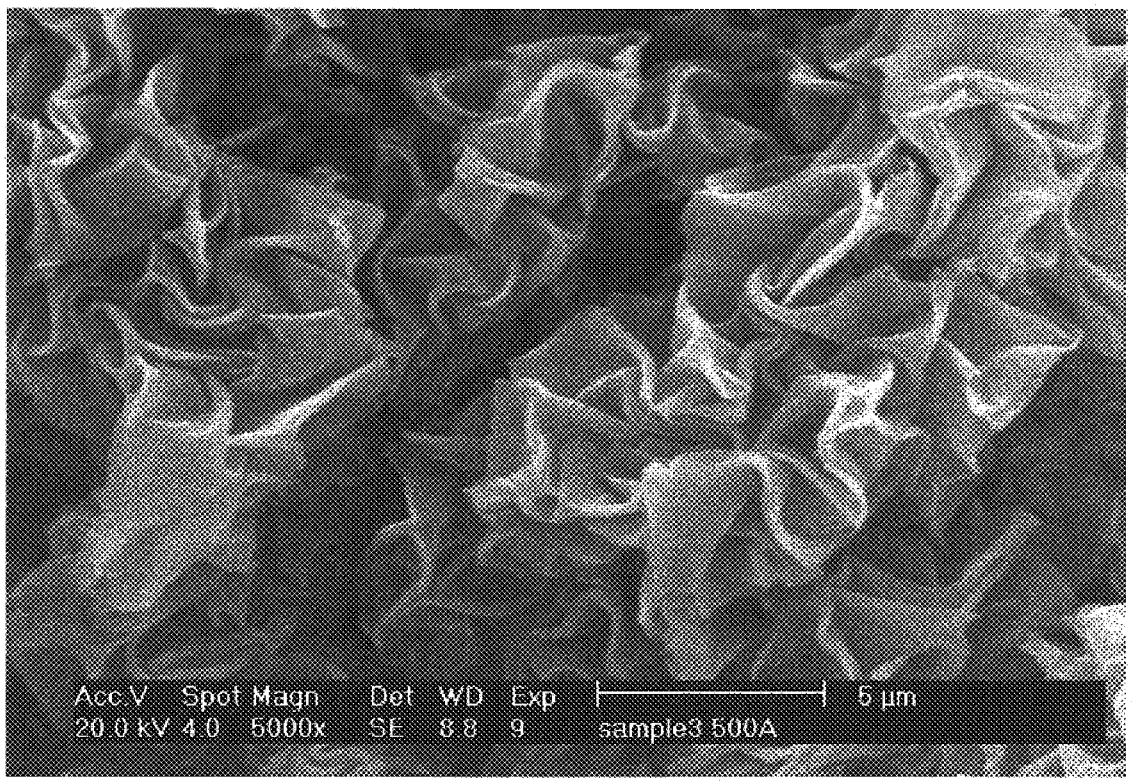
FIG. 17 is a digital image scanning electron micrograph at 5000 magnification of the surface of a 500 Angstrom thick layer of diamond-like glass on shrunken film as prepared in Example 6B.
Figure 18:
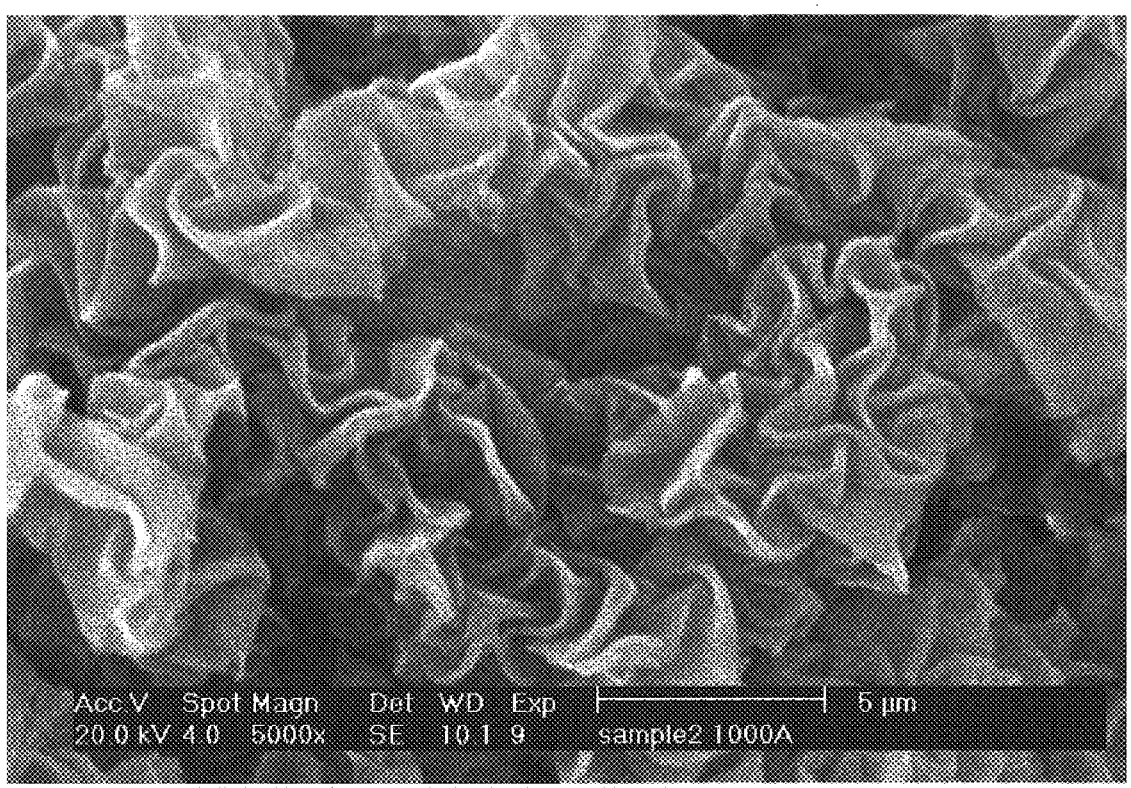
FIG. 18 is a digital image scanning electron micrograph at 5000 magnification of the surface of a 1000 Angstrom thick layer of diamond-like glass on shrunken film as prepared in Example 6C.
Figure 19:
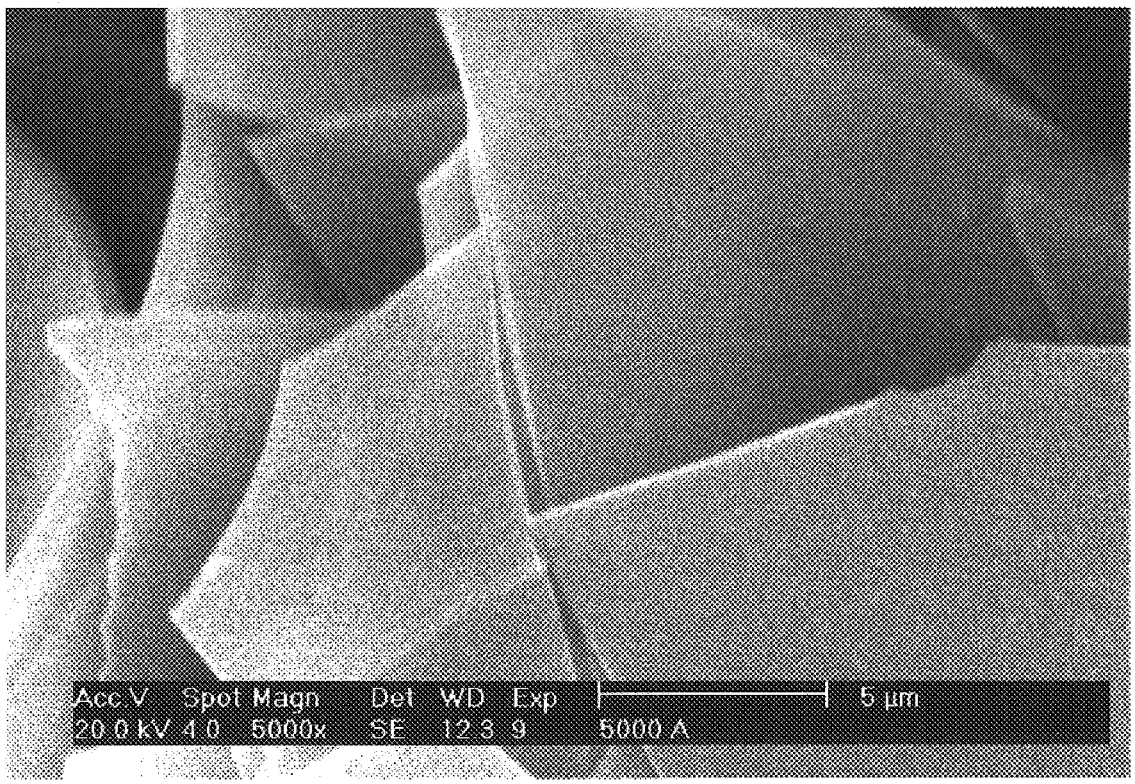
FIG. 19 is a digital image scanning electron micrograph at 5000 magnification of the surface of a 5000 Angstrom thick layer of diamond-like glass on shrunken film as prepared in Example 6D.

Square pieces of the Samples A–D, each 10 cm by 10 cm, were shrunk on a Corning Model PC-400 hot plate with the heat set to "5". As expected all the films shrunk down to about 4% of their original area. None of the DLG films came off the polyethylene films. The surfaces appeared clouded but uniform to the unaided eye. Under light microscopic examination the glass deposited surfaces showed visible convolutions. The films were then examined by scanning electron microscopy (SEM). The element detection system on the SEM was used to analyze the elemental composition of the surfaces. SEM images of the films of Sample B–D before relaxing showed them to be smooth and featureless. SEM images at 5000 magnification of the surface of Sample B–D after relaxing are illustrated in FIGS. 17–19, respectively. As can be seen, the 500 and 1000 Angstrom thick thin films of Samples B and C, respectively, shrunk with the diamond-like glass film taking on the highly convoluted form. However, the 5000 Angstrom thin film appeared shattered into small plates of glass. All three films could not be removed from the shrunken film substrate. A surface scan of the films with the SEM showed the presence of silicon and oxygen atoms in a uniform distribution.

The DLG thin films on the shrink film were then shown able to undergo silylation, i.e., attaching silane, as would be expected for ordinary silica or glass. Unshrunken square pieces of uncoated substrate and of Samples C and D, about 25 mm by 25 mm, were placed in vials with 10 mL of Solution One (10 mL of aminopropyltrimethoxysilane mixed with 85 mL of ethanol and 5 mL of water) and rocked gently for one hour. The pieces were then washed with ethanol followed by water and placed in vials with 10 mL of Solution Two (five milligrams of fluorescein isothiocyanate dissolved in 50 mL of 50 mM 3-[(1,1-dimethyl-2-hydroxyethyl)amino]-2-hydroxypropanesulfonic acid, (C.A.S. registry number 68399-79-1, Sigma Chemical Co., St. Louis, Mo.) (AMPSO) buffer at pH 9.0) and rocked gently overnight. They were then extensively washed with water followed by at least three washes with the AMPSO buffer. The pieces were then dried and shrunk on the Corning hot plate as described above. When examined under a fluorescence microscope the uncoated polyethylene film had essentially no fluorescence as expected. The two samples with DLG deposited films were highly fluorescent and cross section examination showed that the fluorescence, due to silylation, was coming from the coated surface.

Example 7

This example illustrates the utility of a hydrophilic DLG thin film in a microfluidic application involving microchanneled polymer plates. Applications of microfluidic devices include the transport of biological fluids, heat transfer fluids, low-friction/drag surfaces, etc.

In this example, the substrate was an experimental polymethylmethacrylate (PMMA) plate having microchannels for transporting liquids including water. The microchanneled polymer plate was prepared by molding poly (methylmethacrylate) sheet (PLEXIGLASS DR101, from Rohm and Haas Co of Philadelphia, Pa.) against a nickel molding tool containing ribs and reservoirs that correspond to the channel and reservoirs in the polymer plate. The tool measured 26.5 cm by 26.5 cm. The sheet of DRIOI (nominally 250 μm thick) and molding tool were brought into contact with each other at a temperature of 187° C. at a pressure of $6.3 \times 10^5$ Pascal for 2 minutes, after which the pressure was increased to $3.2 \times 10^6$ Pascal for 2.5 minutes. Thereafter the temperature was decreased to nominally 50° C., and the mold and sheet were then separated. The PMMA surface is hydrophobic with a natural tendency to inhibit transport within the channels. This example demonstrated how a modified DLG thin film made the PMMA surface permanently hydrophilic and provided a robust surface for the transport of liquids.

The PMMA surface was primed initially with an oxygen plasma for 60 seconds at a pressure and RF power of 50 mTorr and 500 Watts, respectively. The flow rates of TMS and oxygen for this example were 24 sccm and 750 sccm, respectively. The side of the PMMA surface having the channels was treated for five minutes resulting in a DLG thin film thickness of 600 nanometers. The surface layer was further processed to convert the DLG surface to a hydrophilic surface by exposing it to an oxygen plasma at a pressure and power of 50 mTorr and 500 Watts, respectively, for 2 minutes. The surface was completely wettable to water, with a contact angle of less than 10 degrees.

Example 8

This example illustrates the moisture barrier properties of DLG thin films in a biofluidic application involving polymeric capillaries.

The substrates were experimental polymer capillaries made from either polymethyl methacrylate (PMMA or a polybicyclopentadiene polymer, available as ZEONEX 480R (Zeon Chemicals L.P.,4100 Bells Lane, Louisville, Ky. 40211, U.S.A.). The capillaries had an outside diameter of about 360 microns and an inside diameter of about 50 microns with a length of approximately 60 centimeters. DLG thin films were applied to these capillaries using Plasma Reactor One. The outer surfaces of the PMMA capillaries were primed with an oxygen plasma for 2 minutes on each side at a pressure and RF power of 100 mTorr and 400 Watts, respectively. A second plasma feed gas was TMS and oxygen at flow rates of 150 sccm and 100 sccm, respectively, resulting in a ratio of TMS to oxygen of 1.5. The pressure and power were maintained at 40 Pa (300 mTorr) and 200 Watts, respectively. The second plasma was operated in a pulsed mode with the pulsing frequency and duty cycle maintained at 10 Hz and 90%, respectively. Each side of the capillary was exposed to the plasma for five minutes, resulting in a DLG thin film thickness of about 3 microns. The resulting DLG films were optically clear as determined visually and did not crack or delaminate when the capillaries were bent and flexed. The DLG thin film prevented the evaporation of water that was stored in the capillary. Without the DLG film, the water evaporated by transport through the walls of the capillary. This demonstrated the excellent barrier properties of the DLG thin film.

Having now described the features, discoveries and principles of the invention, the manner in which the process and apparatus is constructed and used, the characteristics of the construction, and the advantageous, new and useful results obtained, the new and useful structures, devices, elements, arrangements, parts, and combinations, are set forth in the appended claims.

What is claimed is:

1. An article comprising:
   a substrate, and
   a film deposited on at least a portion of the substrate, the film comprising a diamond-like glass comprising a dense random covalent system comprising on a hydrogen-free basis at least about 30 atomic percent carbon, at least about 25 atomic percent silicon, and less than or equal to about 45 atomic percent oxygen, wherein the film has an extinction coefficient of less than 0.010 at 250 nm.

2. The article according to claim 1, wherein the thin film comprises from about 30 to about 50 atomic percent carbon.

3. The article according to claim 1, wherein the thin film comprises from about 25 to about 35 atomic percent silicon.

4. The article according to claim 1, wherein the thin film comprises from about 20 to about 40 atomic percent oxygen.

5. The article according to claim 1, wherein the thin film comprises from about 30 to about 36 atomic percent carbon, from about 26 to about 32 atomic percent silicon and from about 35 to about 41 atomic percent oxygen.

6. The article according to claim 1 wherein the thin film is flexible.

7. The article according to claim 1 wherein the thin film has a contact angle with water of less than about 30 degrees.

8. The article according to claim 1, wherein the film is transmissive of at least about 70 percent of radiation at one or more wavelengths of from about 180 to about 800 nanometers when the thickness of the thin film is 1 micron.

9. The article according to claim 1 wherein the thin film is not fluorescent.

10. The article according to claim 1, wherein the film has an extinction coefficient of less than 0.002 at 250 nm.

11. The article according to claim 1, wherein the film has a refractive index of from about 1.4 to about 2.2.

12. The article according to claim 1, wherein the substrate is a film, fiber, or biofluidic device.

13. The article according to claim 1, wherein the substrate is linear and flexible.

14. The article according to claim 1, wherein the film has an optical band gap of greater than 4 electron Volts.

* * * * *

UNITED STATES PATENT AND TRADEMARK OFFICE
CERTIFICATE OF CORRECTION

PATENT NO. : 6,696,157 B1
DATED : February 24, 2004
INVENTOR(S) : David, Moses M.

It is certified that error appears in the above-identified patent and that said Letters Patent is hereby corrected as shown below:

<u>Title page,</u>
Item [75], Inventors, delete "Brian Kenneth Nelson, Shoreview, MN" and insert in place thereof -- Nicholas A. Lee, Woodbury, MN --.

<u>Column 7,</u>
Line 12, after "properties", insert -- . --.

<u>Column 11,</u>
Line 48, delete "Example" and insert in place thereof -- Examples --.

<u>Column 12,</u>
Line 50, delete "ressure" and insert in place thereof -- pressure --.
Line 52, delete "espectively" and insert in place thereof -- respectively --.
Line 55, delete "as" and insert in place thereof -- was --.

Signed and Sealed this

Twenty-seventh Day of September, 2005

JON W. DUDAS
*Director of the United States Patent and Trademark Office*